United States Patent
Nagata et al.

(10) Patent No.: US 9,780,135 B2
(45) Date of Patent: Oct. 3, 2017

(54) IMAGE PICKUP UNIT AND METHOD OF MANUFACTURING THE SAME

(71) Applicant: Sony Corporation, Tokyo (JP)

(72) Inventors: Masaya Nagata, Kanagawa (JP); Taizo Takachi, Kanagawa (JP)

(73) Assignee: Sony Corporation, Tokyo (JP)

( * ) Notice: Subject to any disclaimer, the term of this patent is extended or adjusted under 35 U.S.C. 154(b) by 261 days.

(21) Appl. No.: 13/734,166

(22) Filed: Jan. 4, 2013

(65) Prior Publication Data
US 2013/0181313 A1    Jul. 18, 2013

(30) Foreign Application Priority Data
Jan. 12, 2012 (JP) .................................. 2012-003873

(51) Int. Cl.
H01L 27/146 (2006.01)
H01L 31/18 (2006.01)

(52) U.S. Cl.
CPC .. *H01L 27/14634* (2013.01); *H01L 27/14618* (2013.01); *H01L 27/14687* (2013.01); *H01L 31/18* (2013.01); *H01L 27/14625* (2013.01); *H01L 2224/13* (2013.01)

(58) Field of Classification Search
CPC .............. H01L 27/146; H01L 27/1462; H01L 27/14643
USPC ........ 257/433, 98, E31.001, E27.13, 99, 435
See application file for complete search history.

(56) References Cited

U.S. PATENT DOCUMENTS

| 7,420,754 B2 * | 9/2008 | Nagasaka ............ G02B 6/4201 257/433 |
| 2003/0068850 A1 * | 4/2003 | Fukuda et al. ................ 438/200 |
| 2005/0169620 A1 * | 8/2005 | Minamio .......... H01L 27/14618 257/E25.032 |
| 2007/0267712 A1 * | 11/2007 | Fujita et al. ................... 257/443 |
| 2008/0296573 A1 * | 12/2008 | Suehiro et al. .................. 257/53 |
| 2009/0294779 A1 * | 12/2009 | Ida .................... H01L 27/14618 257/82 |
| 2011/0147782 A1 * | 6/2011 | Sano et al. ....................... 257/98 |
| 2013/0075850 A1 * | 3/2013 | Patterson ............ H01L 31/0232 257/432 |
| 2013/0119501 A1 * | 5/2013 | Yoshida ........................ 257/435 |
| 2014/0145205 A1 * | 5/2014 | Kong et al. .................... 257/76 |

FOREIGN PATENT DOCUMENTS

JP    2009-076629    4/2009

* cited by examiner

*Primary Examiner* — Cuong Q Nguyen
(74) *Attorney, Agent, or Firm* — Chip Law Group

(57) ABSTRACT

An image pickup device and a method of the same are described herein. By way of first example, the image pickup device includes a seal member having a first surface, the first surface of the seal member including a concave portion, and an optical device coupled to a second surface of the seal member, the second surface of the seal member being opposite from the first surface of the seal member. By way of a second example, the image pickup device includes a seal member having a first surface, the first surface being a polished surface, and an optical device coupled to a second surface of the seal member, the second surface of the seal member being opposite from the first surface of the seal member.

14 Claims, 24 Drawing Sheets

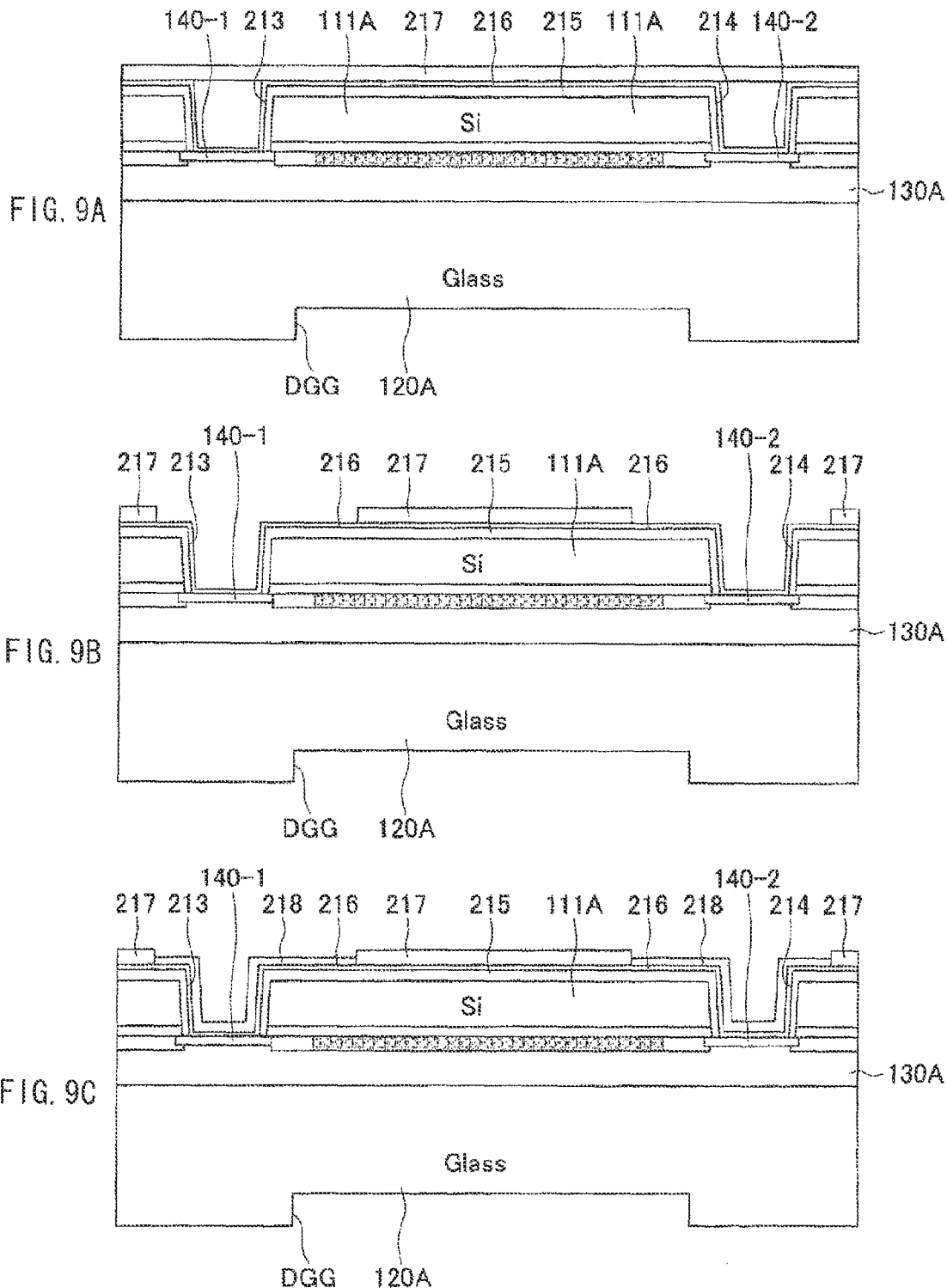

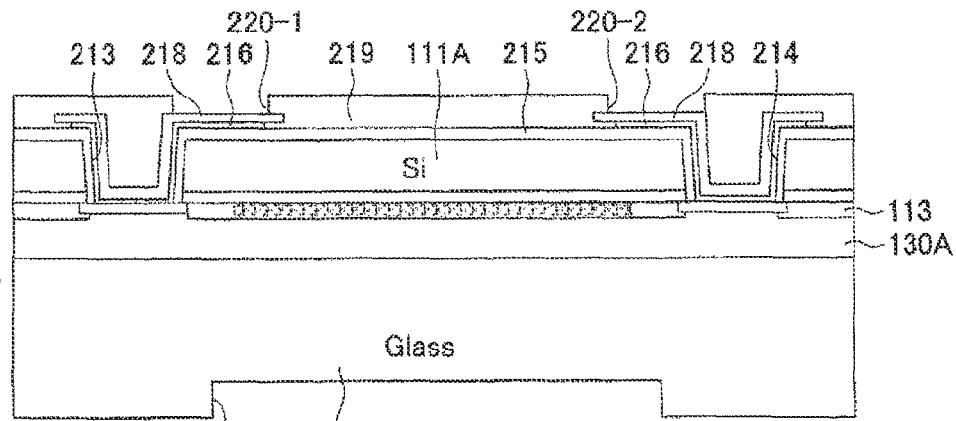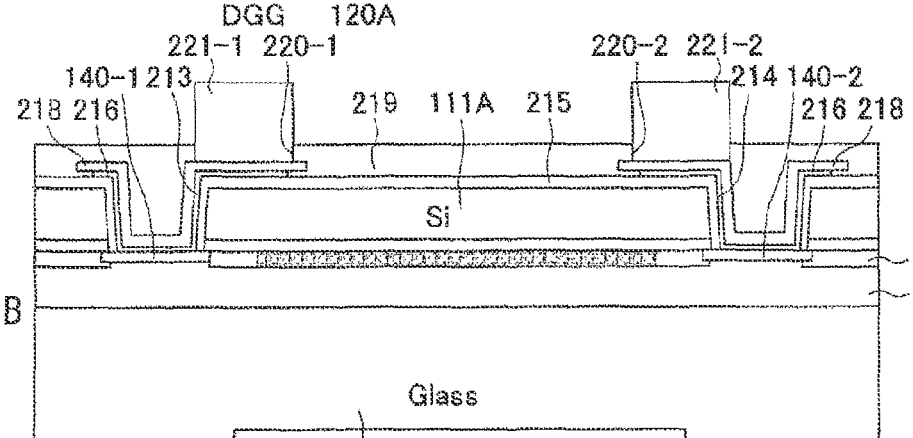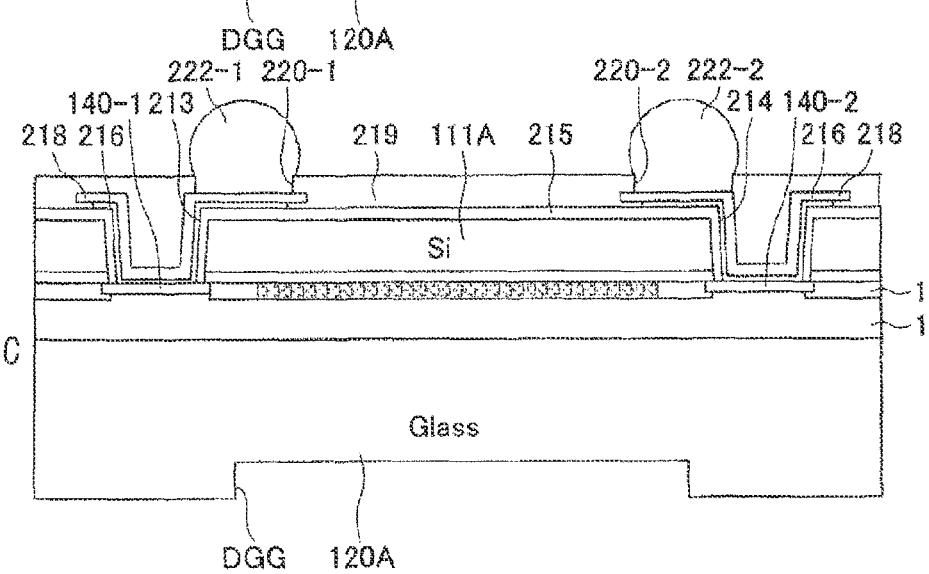

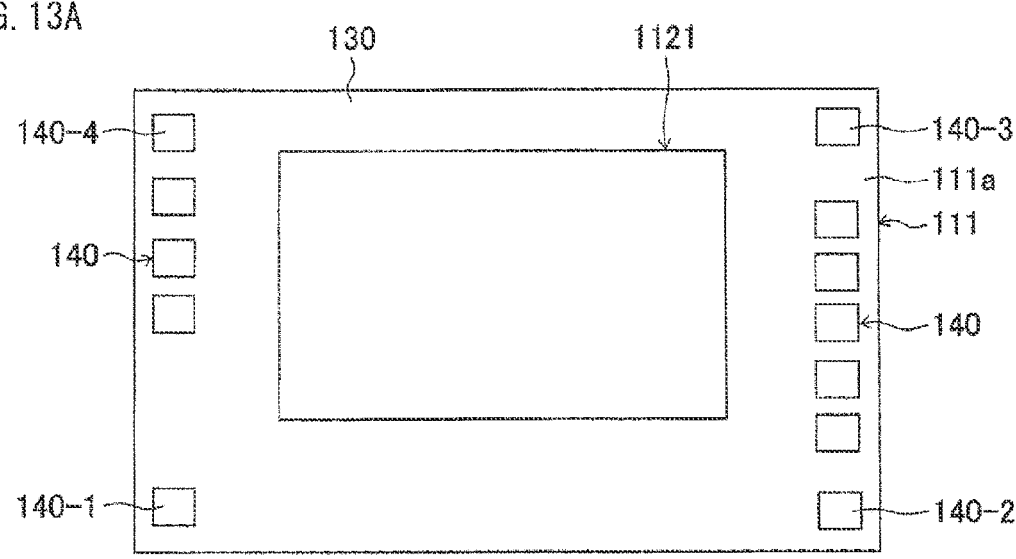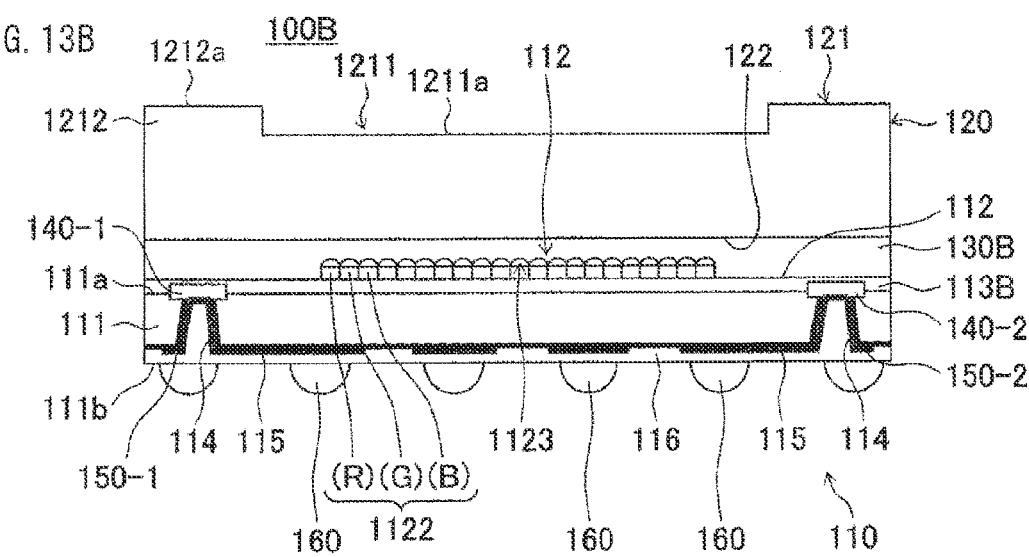

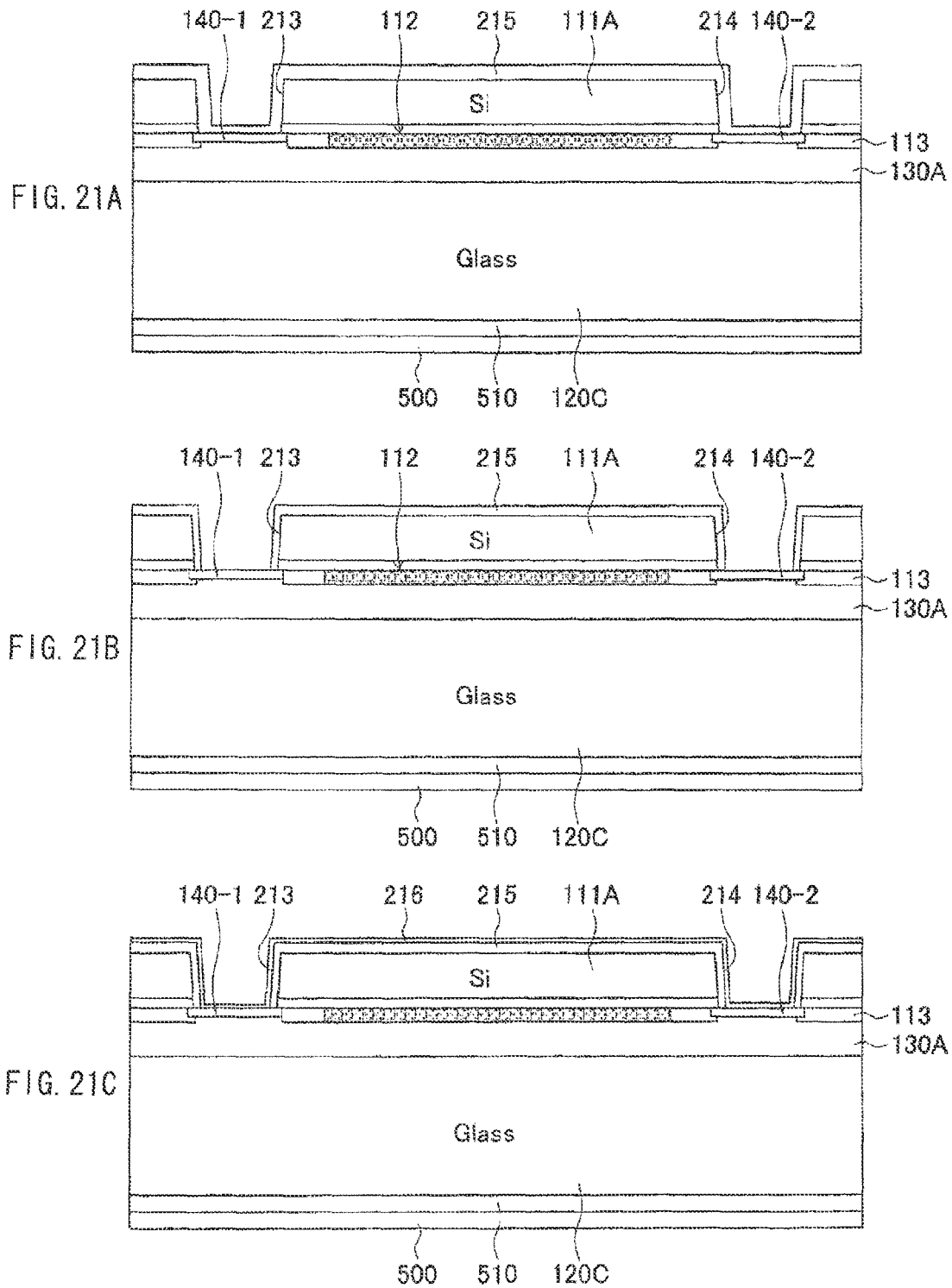

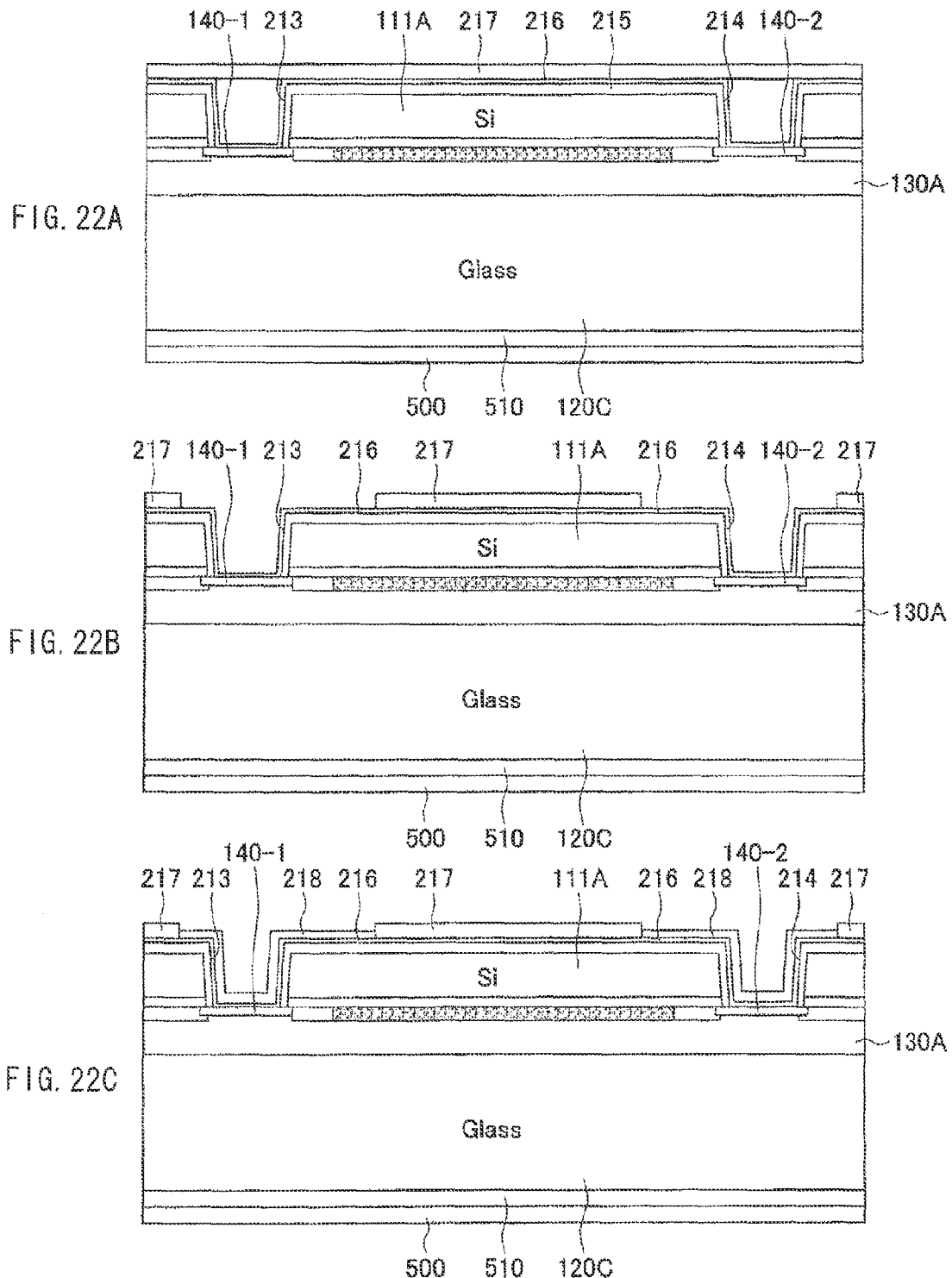

IMAGE PICKUP UNIT AND METHOD OF MANUFACTURING THE SAME

BACKGROUND

This technology relates to an image pickup unit in which an optical sensor such as a charge coupling device (CCD) and a complementary metal-oxide semiconductor (CMOS) image sensor (CIS) is configured as a chip-scale package, and to a method of manufacturing the same.

As a simple method of packaging an optical sensor, a wafer chip scale package (WCSP) structure has been proposed.

It is to be understood that both the foregoing general description and the following detailed description are exemplary, and are intended to provide further explanation of the technology as claimed.

SUMMARY

An image pickup device and a method of the same are described herein. By way of first example, the image pickup device includes a seal member having a first surface, the first surface of the seal member including a concave portion, and an optical device coupled to a second surface of the seal member, the second surface of the seal member being opposite from the first surface of the seal member.

By way of a second example, the image pickup device includes a seal member having a first surface, the first surface being a polished surface, and an optical device coupled to a second surface of the seal member, the second surface of the seal member being opposite from the first surface of the seal member.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 9A to 9C are fifth diagrams for explaining the method of manufacturing the image pickup unit of FIG. 3.

FIGS. 11A to 11C are seventh diagrams for explaining the method of manufacturing the image pickup unit of FIG. 3.

FIGS. 13A and 13B are diagrams each illustrating a second configuration example of the image pickup unit according to the embodiment.

FIGS. 21A to 21C are fourth diagrams for specifically explaining the second method of manufacturing the image pickup unit of FIGS. 14A and 14B.

FIGS. 22A to 22C are fifth diagrams for specifically explaining the second method of manufacturing the image pickup unit of FIGS. 14A and 14B.

DETAILED DESCRIPTION

Hereinafter, embodiments of the technology will be described with reference to drawings.

It is desirable to provide an image pickup unit and a method of manufacturing the same which are capable of preventing enlargement of the unit, complication of processes, and increase in cost, and suppressing generation of scratches, cracks, and the like on a seal member, as well as improving the characteristics and the manufacturing yield of the unit.

Figure 1:
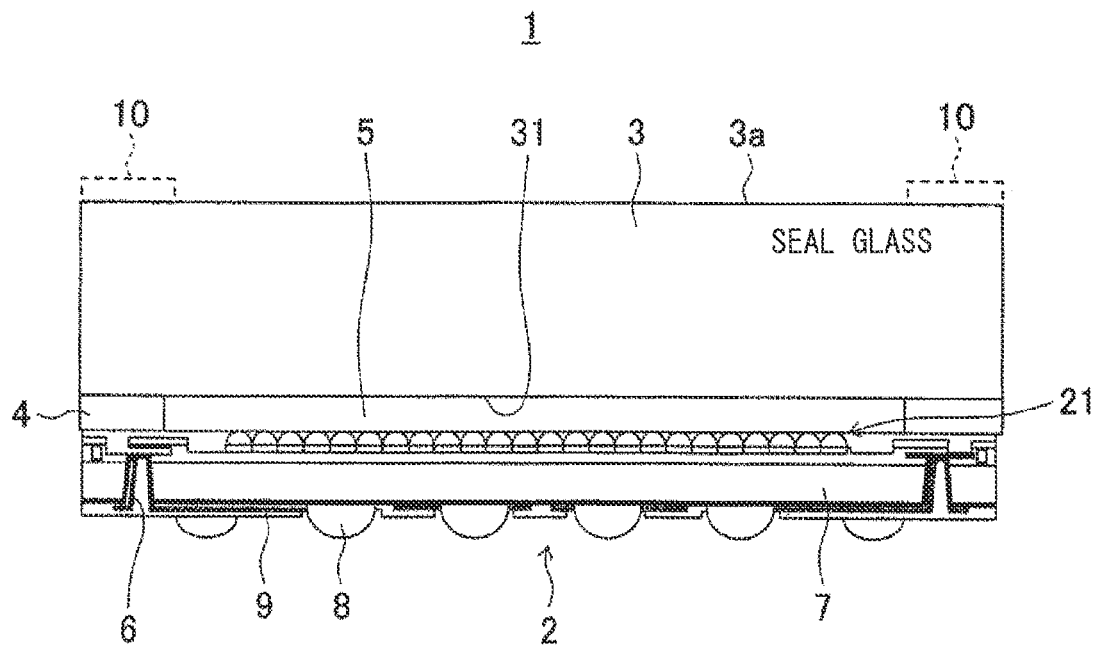
FIG. 1 is a diagram illustrating a basic structure of a WCSP structure.

In Japanese Unexamined Patent Application Publication No. 2009-76629, as shown in the WCSP structure of FIG. 1, a structure including a protection film 10 which has openings is described. The protection film 10 has the openings in a region facing the optical element region (the light receiving portion) of a surface (a front surface) of the seal glass 3, as illustrated by a dashed line in FIG. 1.

The protection film 10 is formed by using, for example, the following conductive materials in consideration of electrostatic chuck and the like in a wafer process. Specifically, the protection film 10 is formed of a high-resistance metal material (such as Ti, TiN, TiW, Ni, Cr, TaN, and CoWP) or a low-resistance metal material (such as Al, Al—Cu, Al—Si—Cu, Cu, Au, and Ag). Alternatively, the protection film 10 is formed of polycrystalline silicon, a polymer compound having conductivity, or a conductive resin material such as a conductive-particle-containing epoxy resin and a conductive-particle-containing polyimide resin.

As described above, the protection film is formed on the outer region of the surface of the seal glass 3 so that a surface 3a of a light incident region of the seal glass 3 has a concave shape. Therefore, the surface 3a of the seal glass 3 is prevented from being directly touched in a wafer process. Thus, it may be possible to suppress generation of scratches, cracks, and the like on the seal glass 3, and to accordingly improve the characteristics and the manufacturing yield of the image pickup unit.

Figure 2:
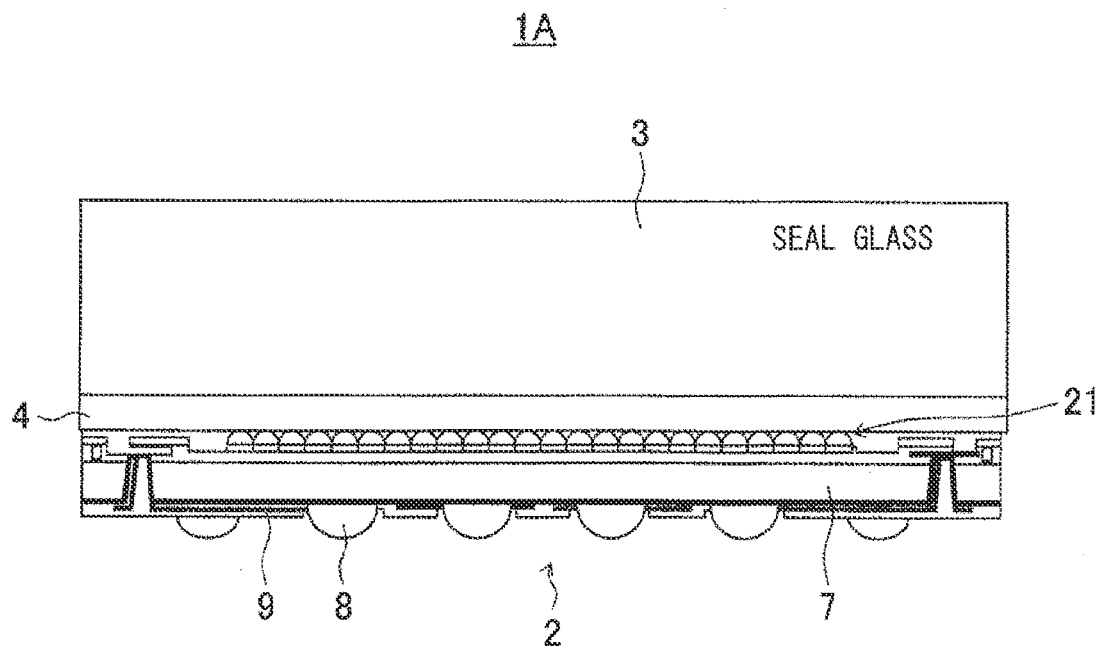
FIG. 2 is a diagram illustrating a structure of a WCSP structure without a gap.

FIG. 2 is a diagram illustrating another structure of the WCSP structure. A WCSP structure 1A in FIG. 2 is configured by filling the gap 5 with the resin 4 in the WCSP structure 1 of FIG. 1. Therefore, the WCSP structure 1A is configured as a WCSP structure without a gap. Hereinafter, such a WCSP structure without a gap is referred to as a cavity less WCSP structure in some cases.

Employing the cavity less WCSP structure without a gap enables significant reduction of thermal stress generated in a gap of the WCSP structure which has the gap. Therefore, occurrence of warpage is allowed to be suppressed. Further, the cavity less WCSP structure is allowed to optically suppress reflection generated on an interface of the gap (having a refractive index of 1) with use of a resin which has a refractive index of 1.5. Therefore, it is expected to increase in an amount of light received by the optical device 2.

Figure 3A:
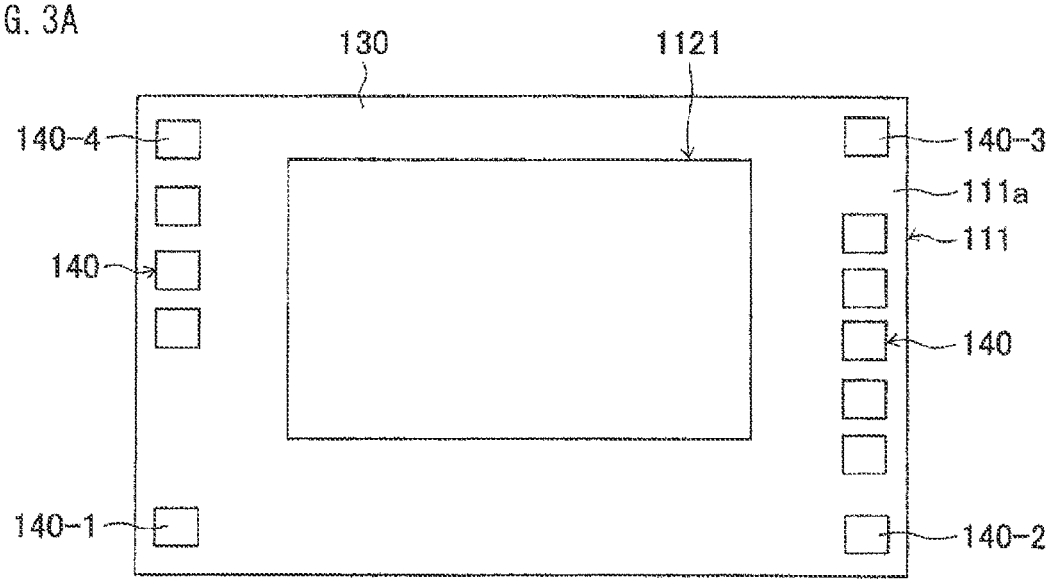
FIGS. 3A and 3B are diagrams each illustrating a first configuration example of an image pickup unit according to an embodiment of the disclosure.
Figure 3B:
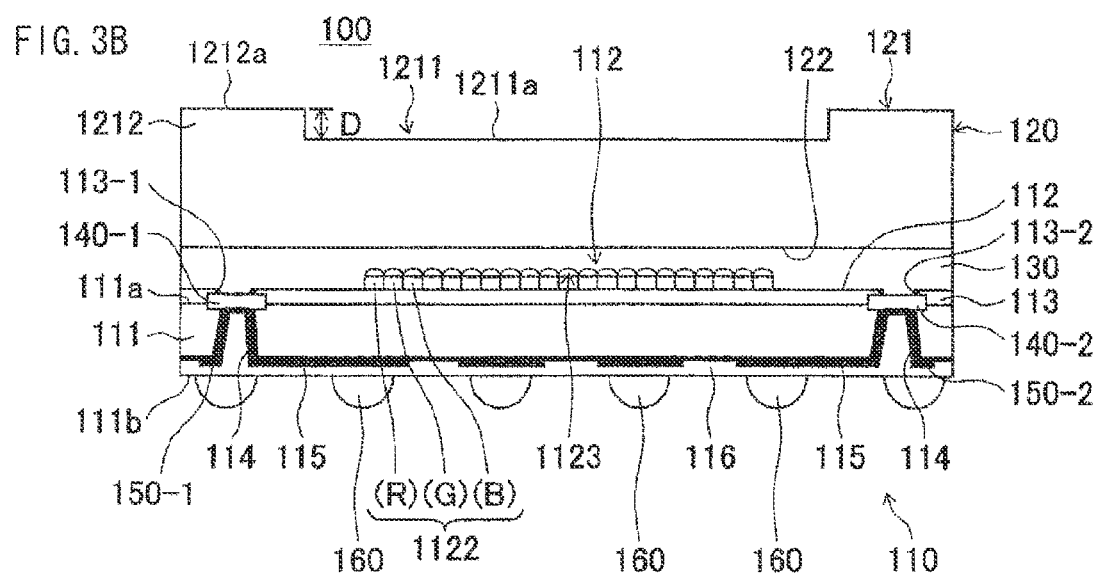

FIGS. 3A and 3B are diagrams each illustrating a first configuration example of an image pickup unit according to an embodiment of the disclosure. FIG. 3A is a plan view illustrating a configuration example in which a resin layer (an intermediate layer) is disposed on a first surface of a substrate, and FIG. 3B is a simplified side view illustrating an overall configuration of the image pickup unit. In the embodiment, as an example of an optical device (an optical sensor), a CMOS image sensor (CIS) is employed.

An image pickup unit 100 of the embodiment basically has a WCSP structure which is packaged in a size of an optical sensor chip. The image pickup unit 100 may employ a cavity structure in which a gap is formed between an optical element region (a light receiving portion) of an optical device and a surface facing the light receiving portion, of a seal glass, or a cavity less WCSP structure without a gap. In the embodiment, the cavity less WCSP structure is described. In the embodiment, the first surface (a front surface) is a surface formed with the light receiving portion of the optical device as the optical sensor of the image pickup unit, namely, a surface on a side from which image light of a subject enters. A second surface (a back surface) is a surface which does not receive light and is provided with connection electrodes such as solder balls (bumps), an interposer, and the like, namely, a surface opposite to the first surface.

The image pickup unit 100 includes an optical device 110, a seal member 120, a resin layer 130 as an intermediate layer, connection pads 140 as electrode pads or external connection terminals, via electrodes 150 (150-1 and 150-2), and external connection terminals 160.

Incidentally, the resin layer 130 and the seal member 120 are each formed of a material which is transparent to light and allows light to pass therethrough. The refractive index of each of these materials is higher than that of the air. For example, the resin layer 130 and the seal member 120 are each formed of a material having a refractive index of about 1.5. In the configuration of FIGS. 3A and 3B, an example in which the seal member 120 is formed of a glass is illustrated. In this case, the seal member 120 may be formed as a seal glass or a cover glass. The resin layer 130 has a function as a seal member, in addition to a function as a protection film for the optical element region.

In the optical device 110, an optical element region 112 which functions as the light receiving portion is formed on a first surface (a front surface) 111a of a sensor substrate (a silicon substrate) 111. The external connection terminals 160 such as bumps, which are electrodes connected to the outside, are formed on a second surface (a back surface) 111b. In the optical device 110, the connection pads 140 which serve as electrode pads (140-1 to 140-4) or external connection terminals are formed on end portions (right and left end portions in FIGS. 3A and 3B) on the first surface 111a of the sensor substrate 111. In the optical device 110, an insulating film 113 is formed in a region except for filter portions of the optical element region 112, on the first surface 111a of the sensor substrate 111. In the insulating film 113, the connection pads 140 are embedded. Parts of the insulating film 113 are opened to form openings 113-1 and 113-2 on the first surface 111a of the sensor substrate 111. A non-connection surface of the connection pad 140 is exposed through the openings. In addition, the resin layer 130 is also formed inside the openings of the insulating film 113, and the connection pads 140 are covered with the resin layer 130, on the first surface 111a of the sensor substrate 111. The connection pads 140 which are formed as the external connection terminals on the first surface 111a of the sensor substrate 111 of the optical device 110 may be opened as wire bonding pads or may not be opened. Moreover, each of the connection pads 140 may not be a metal layer on an uppermost layer of stacked wirings in the optical device 110. Note that the opening means a state where the insulating film 113 is partially removed and the pad is accordingly exposed, and where test terminals and the like are directly connectable in manufacturing and the like.

In the optical device 110, the via electrodes 150 (150-1 and 150-2) are formed by through silicon vias 114 which pass through the sensor substrate 111 from the first surface 111a to the second surface 111b. This enables bonding of a glass in a wafer state without wirings by a wire bonding, in a clean room. Each of the via electrodes 150 (150-1 to 150-4) is connected to the external connection terminal 160 on the second surface 111b of the sensor substrate 111. The external connection terminal 160 is connected to a terminal of an external reference potential (a ground potential) and the like through a wiring 115.

Figure 4:
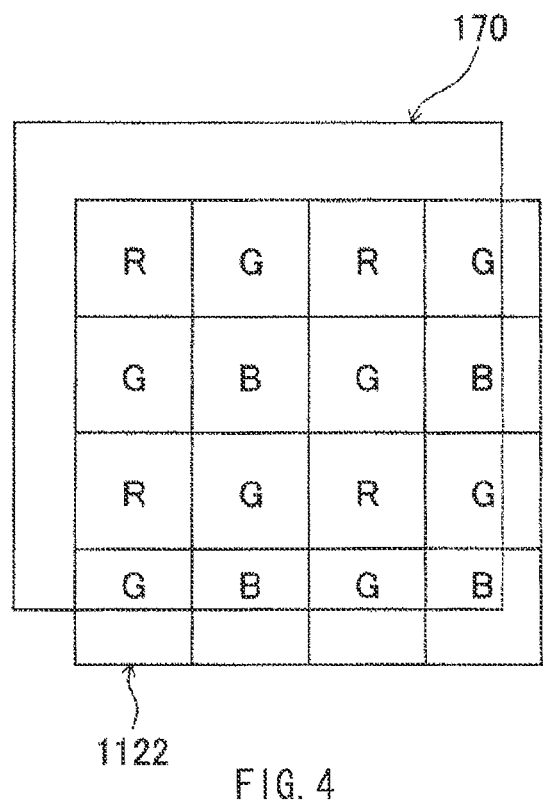
FIG. 4 is a diagram illustrating a configuration example of a color filter according to the embodiment.

The optical element region 112 as the light receiving portion is formed on the first surface 111a of the sensor substrate 111, and has a light receiving surface (a pixel array portion) 1121 which includes a plurality of pixels (photodetection devices) arranged in a matrix. In the optical element region 112, a color filter 1122 is formed on a front surface side of the pixel array portion 1121. In the color filter 1122, color filters of red (R), green (G), and blue (B) which are three primary colors, are formed in an array as an on chip color filter (OCCF) with Bayer arrangement, for example, as illustrated in FIG. 4. However, the arrangement pattern of the color filters is not necessarily limited to Bayer pattern. Incidentally, in the example of FIG. 4, an infrared cutoff filter (IRCF) 170 is formed to be overlaid on the color filter 1122.

In the optical element region 112, a microlens array 1123 intended to collect incident light in each pixel is disposed on a front surface side of the color filter 1122. In the optical element region 112, an anti-reflection film and the like are formed on a front surface side of the microlens array 1123.

The seal member (the seal glass) 120 is formed so that an outer region 1212 is formed to be higher in height than an inner region 1211 on the front surface (the surface) 121 on a side from which the image light of a subject enters. The inner region 1211 has an area larger than that of a region facing the optical element region 112 of the optical device 110 by a constant area. In other words, the seal glass 120 is formed to have a concave shape in which the central inner region 1211 is lower in height than the outer region 1212 on the front surface 121.

Since the seal glass 120 has such a configuration, in a wafer process in manufacturing, only the front surface 1212a of the outer region 1212 on the front surface 121 of the seal glass 120 is directly touched at the time of being carried or being mounted on a stage or the like of a processing apparatus. Therefore, in the wafer process, a surface 1211a of the inner region 1211 on the front surface 121 of the seal glass 120 is prevented from being directly touched. As a result, generation of scratches, cracks, and the like is suppressed, and the characteristics and the manufacturing yield of the image pickup unit are improved. As described above, since the seal glass 120 of the embodiment is formed by recessing the glass itself along the inner region 1211 without using a separate member for recessing, the enlargement of the image pickup unit, the complication of processes, and the increase in cost are prevented while generation of scratches, cracks, and the like in the seal member is suppressed. As a result, the seal glass 120 of the embodiment improves the characteristics and the manufacturing yield of the image pickup unit. A specific manufacturing method will be described in detail later.

In addition, since the outer region 1212 has a depth D from the front surface 1212a of the outer region 1212 to the surface 1211a of the inner region 1211, the seal glass 120 of the embodiment exerts the following functions and effects. The outer region 1212 is surrounded by the air. Thus, the outer region 1212 functions as a so-called waveguide (an optical waveguide). Accordingly, light traveling toward the optical element region 112, of light which has entered the front surface 1212a or the like is guided by the outer region 1212 for a predetermined distance so as to go straight toward a region formed with the connection pad 140 illustrated in FIG. 3B. Consequently, light which has entered the front surface 1212a of the outer region 1212 which is higher in height than the surface 1211a of the inner region 1211 is prevented from becoming stray light to the optical element region 112. As a result, the outer region 1212 contributes to prevention of lowering in the sensitivity of the optical element region (the light receiving portion) and the manufacturing yield.

The resin layer 130 is formed to fill a gap between the first surface 111a formed with the optical element region 112 having the above described configuration, of the sensor substrate 111 and the surface 122 facing the first surface 111a, of the seal member (the seal glass) 120. In addition, as described above, the resin layer 130 is formed to fill a portion reaching the connection portion of the connection pad 140 in the opening formed in the insulating film 113. In other words, the image pickup unit 100 of the embodiment is formed to have a so-called cavity less structure. Note that the thickness of the resin layer 130 is set to about 10 μm to about 100 μm, for example. In addition, the thickness of the seal glass 120 is set to about 450 μm to about 800 μm, for example.

[Method of Manufacturing Image Pickup Unit of FIGS. 3A and 3B]

Next, a method of manufacturing the image pickup unit 100 having the above-described structure will be described. FIG. 5A to FIG. 11C are diagrams for explaining the method of manufacturing the image pickup unit according to the embodiment.

(Step ST1)

Figure 5A:
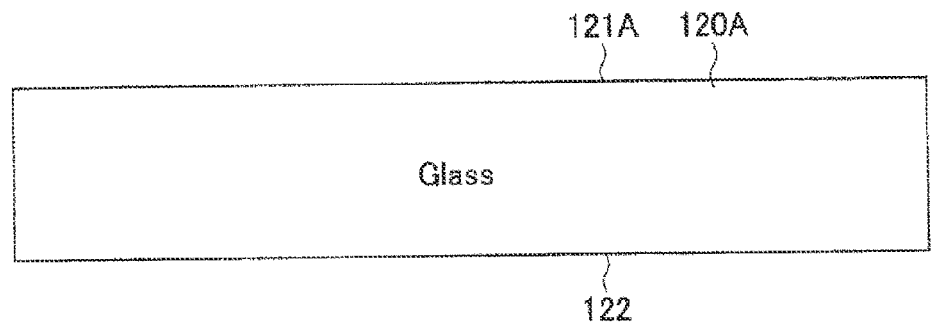
FIGS. 5A to 5C are first diagrams for explaining a method of manufacturing the image pickup unit of FIG. 3.
Figure 5B:
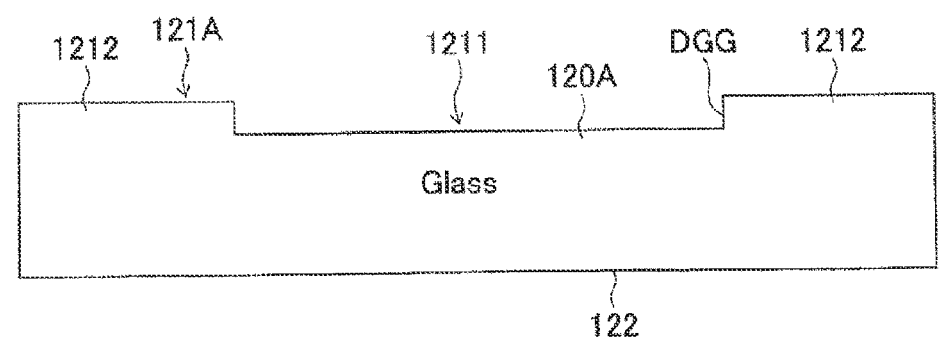
Figure 5C:
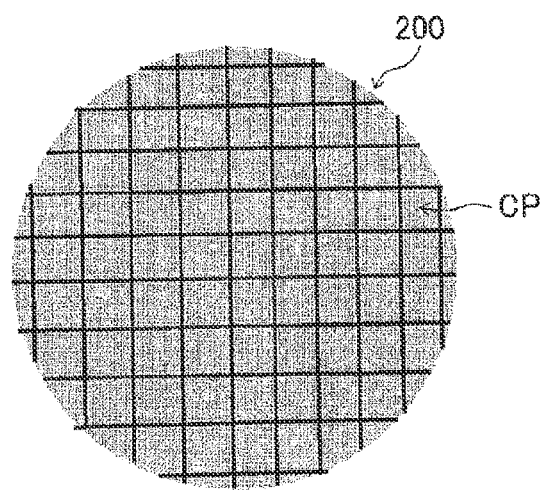

As illustrated in FIGS. 5A and 5B, in a step ST1, a recessed portion DGG having the depth D is formed in a region to be the inner region 1211 on the front surface 121A of a square glass substrate 120A which has been cleaned and is to be the seal glass 120. The outer region 1212 is formed in the periphery of the glass substrate 120A by the inner region 1211. In this case, for example, as illustrated in FIG. 5C, the recessed portion DGG is formed for each chip CP on the glass substrate 200 according to a chip map.

(Step ST2)

Figure 6A:
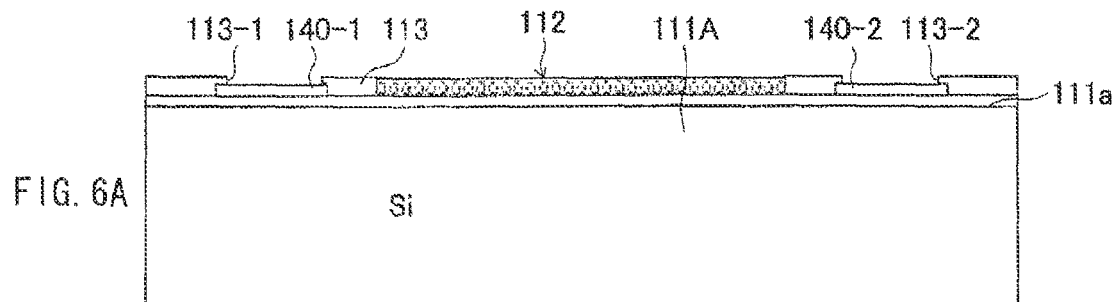
FIGS. 6A to 6C are second diagrams for explaining the method of manufacturing the image pickup unit of FIG. 3.

As illustrated in FIG. 6A, in a step ST2, a sensor portion as the optical element region 112, the connection pads 140, and the like are formed on the first surface 111a of the silicon substrate (the sensor substrate) 111A, and then the insulating film 113 is formed. Then, the openings 113-1 and 113-2 each reaching the connection pad 140 are formed in the insulating film 113. The openings are intended to measure sensor property in advance and select a favorable chip.

(Step ST3)

Figure 6B:

As illustrated in FIG. 6B, in a step ST3, on the first surface 111a side of the silicon substrate 111A, a film 130A is formed to cover the optical element region 112 and the insulating film 113, and to fill the openings 113-1 and 113-2 so as to reach the connection pad 140. The film 130A forms the resin layer 130 as the intermediate layer.

(Step ST4)

Figure 6C:
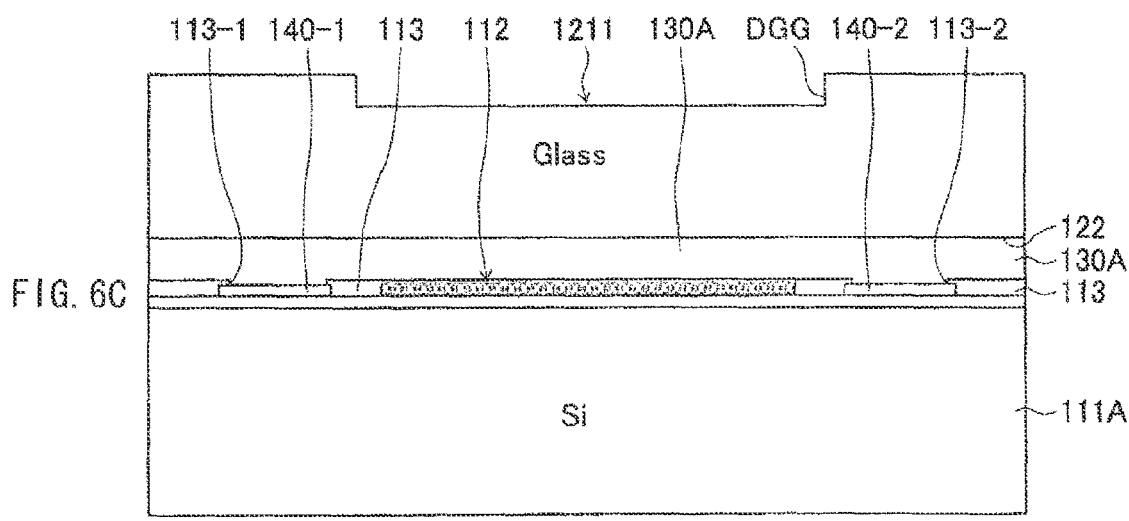

As illustrated in FIG. 6C, in a step ST4, the film 130A is bonded to a surface 122 not formed with the recessed portion DGG, of the glass substrate 120A illustrated in FIG. 5B. Specifically, in the step ST4, the glass substrate 120A formed with the recessed portion DGG is bonded, through the film 130A, to the optical device 110 including the optical element region 112 which is formed on the silicon substrate 111A. Next and follow steps are a wiring formation process.

(Step ST5)

Figure 7A:
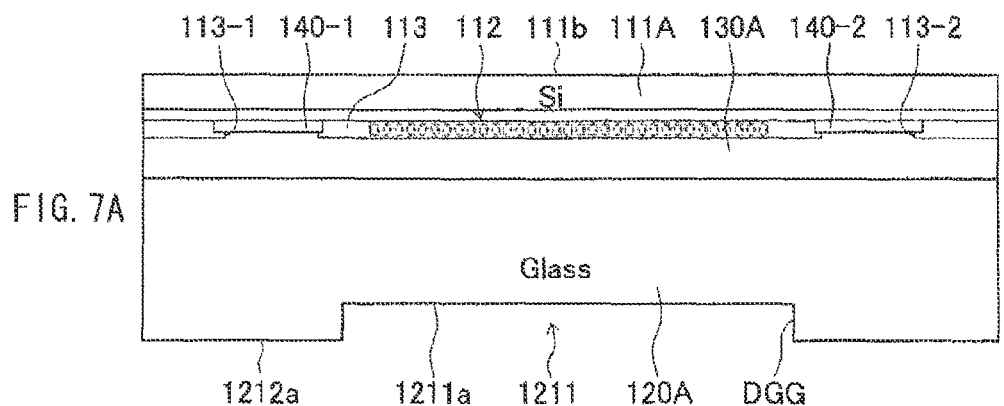
FIGS. 7A to 7C are third diagrams for explaining the method of manufacturing the image pickup unit of FIG. 3.

As illustrated in FIG. 7A, in a step ST5, the surface 121A side formed with the recessed portion DGG of the glass substrate 120A is mounted on a processing apparatus. Then, the second surface 111b of the silicon substrate 111A is abraded by back ground remove (BGR) and chemical mechanical polishing (CMP), to the thickness where the via electrodes are allowed to be formed. For example, the silicon substrate 111A having the thickness of about 700 μm is abraded to the thickness of about 100 μm to about 50 μm. As described above, in the manufacturing process, only the front surface 1212a of the outer region 1212 of the front surface 121A of the glass substrate 120A is directly touched at the time of being carried or being mounted on a stage of a processing apparatus. Therefore, in a wafer process, the surface 1211a of the inner region 1211 on the front surface 121 of the seal glass 120 is prevented from being directly touched. As a result, generation of scratches, cracks, and the like is suppressed, and the characteristics and the manufacturing yield of the image pickup unit are improved.

(Step ST6)

Figure 7B:
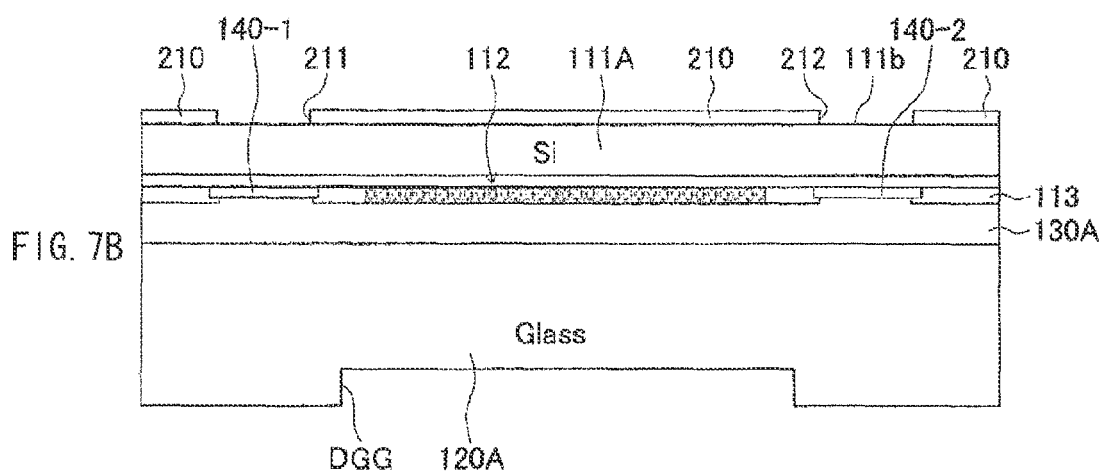

As illustrated in FIG. 7B, in a step ST6, a mask 210 is formed by photolithography and the like in a predetermined position of the second surface 111b side of the silicon substrate 111A, except for predetermined positions 211 and 212 in which TSVs are to be formed.

(Step ST7)

Figure 7C:
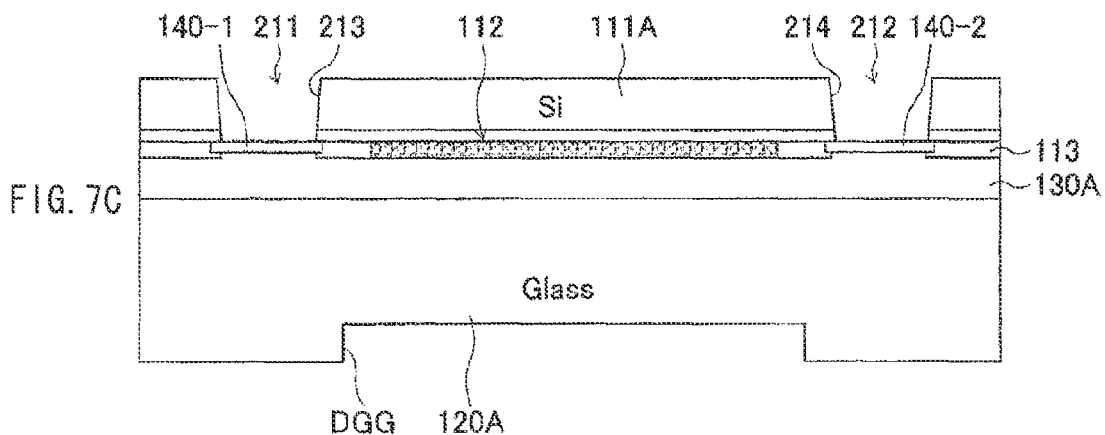

As illustrated in FIG. 7C, in a step ST7, TSVs 213 and 214 each reaching the connection pad 140 are formed in the predetermined positions 211 and 212 on the second surface 111b side of the silicon substrate 111A by etching. After that, the mask 210 is removed.

(Step ST8)

Figure 8A:
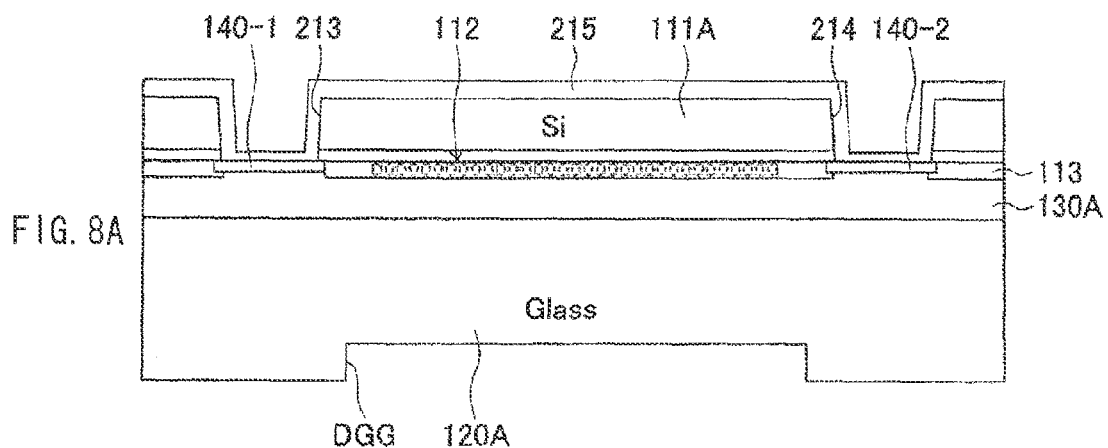
FIGS. 8A to 8C are fourth diagrams for explaining the method of manufacturing the image pickup unit of FIG. 3.

As illustrated in FIG. 8A, in a step ST8, for example, a oxidized insulating film 215 is formed to have a thickness of about 10 μm on the entire surface including the inside of the TSVs 213 and 214 of the second surface 111b side of the silicon substrate 111A.

(Step ST9)

Figure 8B:
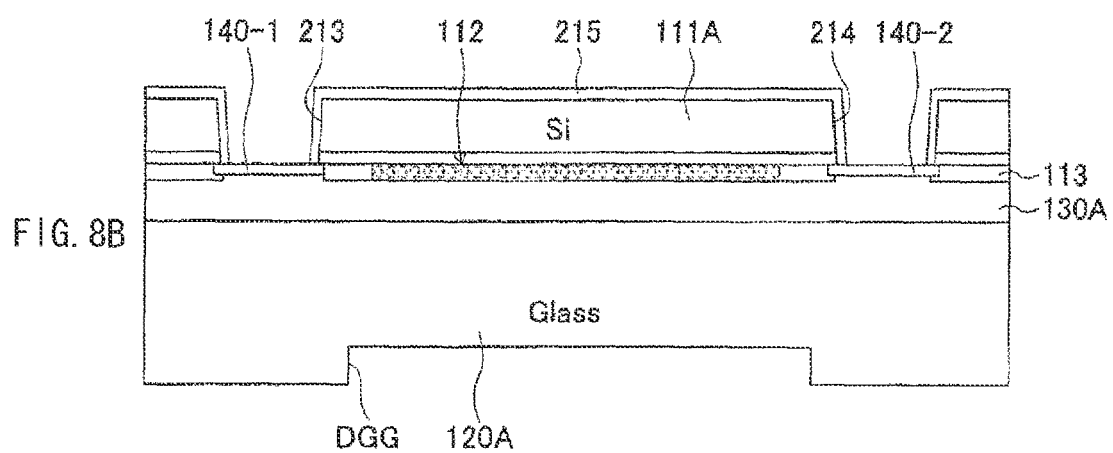

As illustrated in FIG. 8B, in a step ST9, etching is performed on the second surface 111b side of the silicon substrate 111A to remove the insulating film 215 formed on the bottom of each of the TSVs 213 and 214. As a result, the surfaces of the connection pads 140-1 and 140-2 in the TSVs 213 and 214 are exposed. The remaining insulating film 215 has a thickness smaller than 10 μm.

(Step ST10)

Figure 8C:
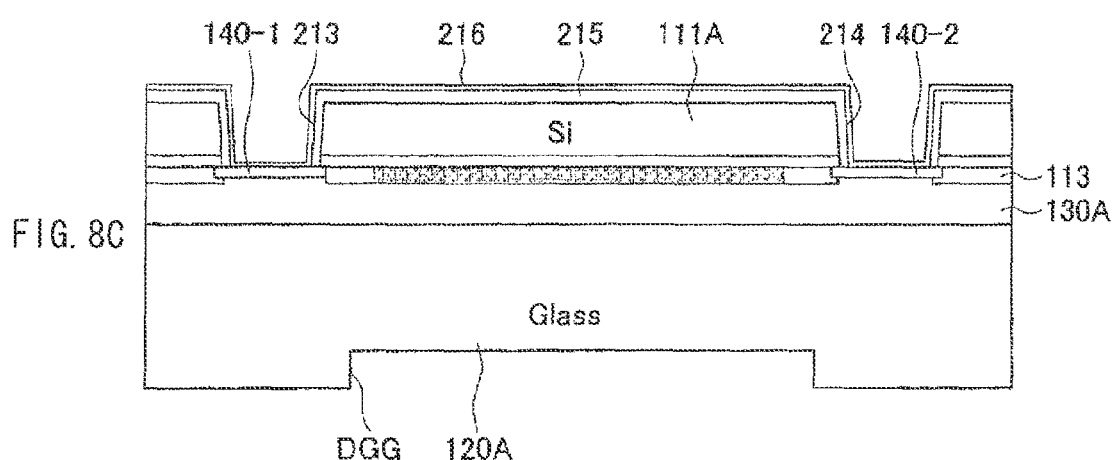

As illustrated in FIG. 8C, in a step ST10, a seed layer 216 as a conductive layer is formed to have a thickness of about 0.1 μm to about 1 lam on the entire surface including the inside of the TSVs 213 and 214 of the second surface 111b side of the silicon substrate 111A. The seed layer 216 is formed of a stacked film of, for example, titanium (Ti) and copper (Cu).

(Step ST11)

As illustrated in FIG. 9A, in a step ST11, a resist 217 is bonded to the entire surface including above the TSVs 213 and 214 of the second surface 111b of the silicon substrate 111A.

(Step ST12)

As illustrated in FIG. 9B, in a step ST12, the resist 217 is removed from the inside of the TSVs 213 and 214 and the surrounding regions of the TSVs 213 and 214 on the second surface 111b of the silicon substrate 111A.

(Step ST13)

As illustrated in FIG. 9C, in a step ST13, a wiring layer 218 is formed to have a thickness of about 5 μm inside the TSVs 213 and 214 and in the surrounding regions of the TSVs 213 and 214 on the second surface 111b of the silicon substrate 111A. The wiring layer 218 is formed of, for example, Cu. Then, the wiring 115 in FIG. 3B is formed by the wiring layer 218 and the seed layer 216.

(Step ST14)

Figure 10A:
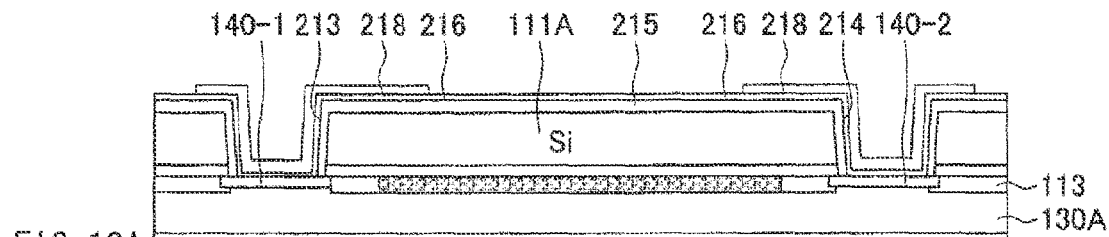
FIGS. 10A to 10C are sixth diagrams for explaining the method of manufacturing the image pickup unit of FIG. 3.

As illustrated in FIG. 10A, in a step ST14, the resist 217 remaining on the second surface 111b of the silicon substrate 111A is removed.

(Step ST15)

Figure 10B:
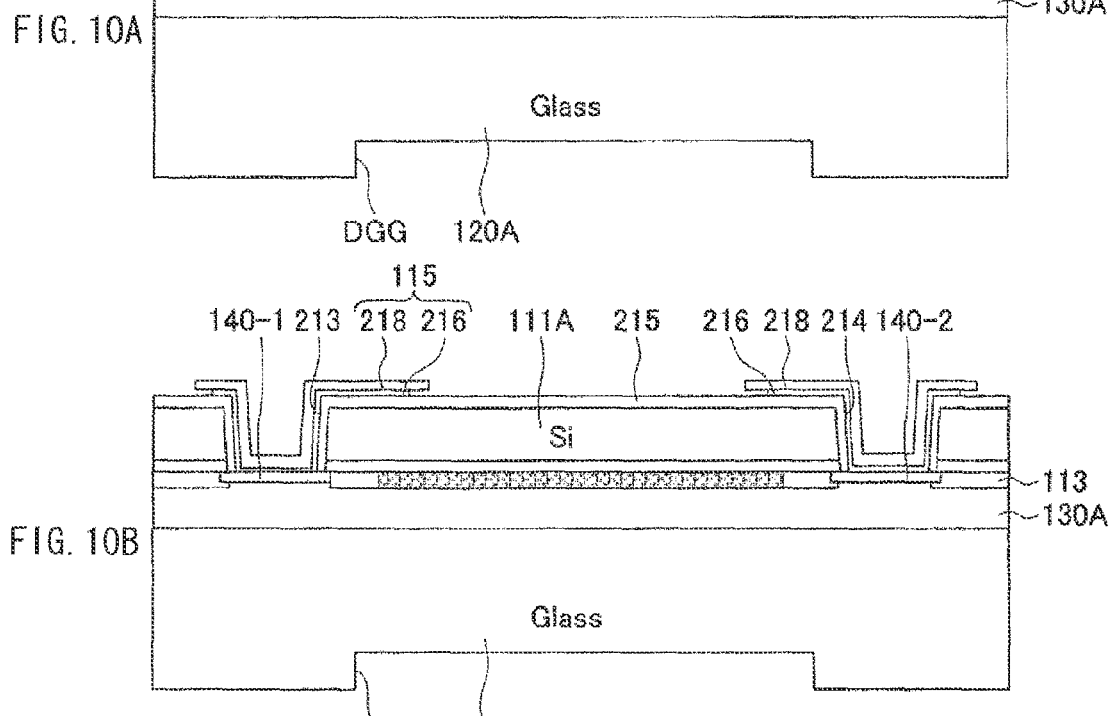

As illustrated in FIG. 10B, in a step ST15, the seed layer 216 is removed, by etching, from a region in which the wiring layer 218 is not formed and the boundary region thereof on the second surface 111b of the silicon substrate 111A.

(Step ST16)

Figure 10C:
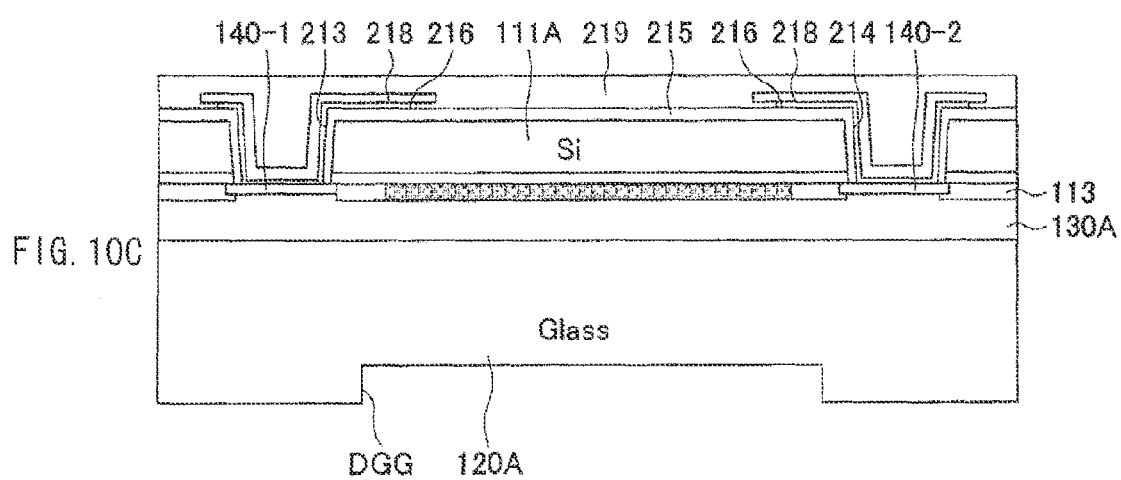

As illustrated in FIG. 10C, in a step ST16, a solder mask 219 is formed on the entire surface including above the TSVs 213 and 214 on the second surface 111b of the silicon substrate 111A.

(Step ST17)

As illustrated in FIG. 11A, in a step ST17, openings 220-1 and 220-2 each reaching the wiring layer 218 are formed in the solder mask 219 in a region which is adjacent to the region inner than the region formed with the TSVs 213 and 214 on the second surface 111b of the silicon substrate 111A.

(Step ST18)

As illustrated in FIG. 11B, in a step ST18, solders 221-1 and 221-2 are printed or solder balls are provided in the openings 220-1 and 220-2 on the second surface 111b of the silicon substrate 111A so as to reach the wiring layer 218 and to be exposed from the openings 220-1 and 220-2.

(Step ST19)

As illustrated in FIG. 11C, in a step ST19, solder balls 222-1 and 222-2 are formed by reflow. The solder balls 222-1 and 222-2 form the external connection terminals 160 in FIG. 3B.

In this way, the manufacturing of the image pickup unit 100 is completed.

According to the embodiment, the seal glass 120 is formed to have a concave shape in which the central inner region 1211 is lower in height than the outer region 1212 on the front surface 121. Since the seal glass 120 has such a configuration, in a wafer process in manufacturing, only the front surface 1212a of the outer region 1212 on the front surface 121 of the seal glass 120 is directly touched at the time of being carried or being mounted on a stage or the like of a processing apparatus. Therefore, in the wafer process, the surface 1211a of the inner region 1211 on the front surface 121 of the seal glass 120 is prevented from being directly touched. As a result, generation of scratches, cracks, and the like is suppressed, and the characteristics and the manufacturing yield of the image pickup unit are improved. As described above, since the seal glass 120 of the embodiment is formed by recessing the glass itself along the inner region 1211 without using a separate member for recessing, the enlargement of the image pickup unit, the complication of processes, and the increase in cost are prevented while generation of scratches, cracks, and the like in the seal member is suppressed. Consequently, according to the embodiment, it may be possible to improve the characteristics and the manufacturing yield of the image pickup unit.

As described above, in the manufacturing process, the recessed portion DGG with the depth D is formed in a region to be the inner region 1211 on the front surface 121A of the glass substrate 120A. Therefore, only the front surface 1212a of the outer region 1212 on the front surface 121A of the glass substrate 120A is directly touched at the time of being carried or being mounted on a stage or the like of a processing apparatus. Accordingly, the surface 1211a of the inner region 1211 on the front surface 121A of the glass substrate 120A is prevented from being directly touched in the wafer process. Thus, generation of scratches, cracks, and the like is suppressed, and the characteristics and the manufacturing yield of the image pickup unit are improved.

Figure 12A:
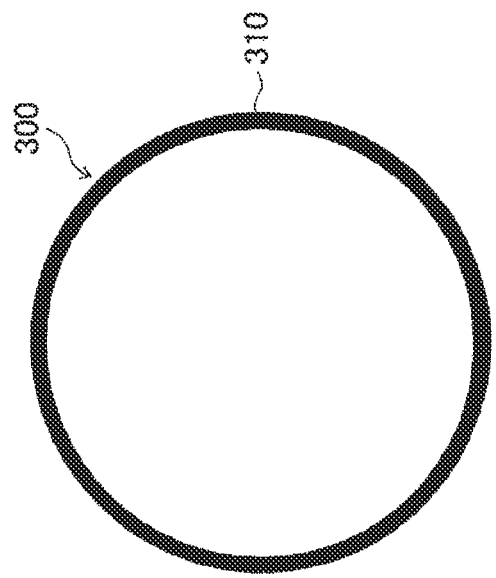
FIGS. 12A and 12B are diagrams for explaining a manufacturing method in which a glass is processed to allow an outer region of a glass wafer to be higher in height than inner portion thereof, and a bonding process to a silicon substrate and the like are then performed.
Figure 12B:
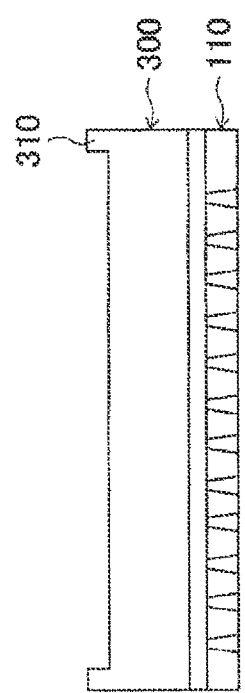

Incidentally, in the above-described manufacturing method, the recessed portion DGG is formed for each chip CP on the glass substrate 200 according to a chip map. For example, as illustrated in FIGS. 12A and 12B, in the present technology, a glass may be processed so that an outer region 310 of a glass wafer 300 is higher in height than inner side, and then each of processes such as bonding with the silicon substrate 111 as described above may be performed. Also in the manufacturing method, the surface 1211a of the inner region 1211 on the front surface 121A of the glass substrate 120A is prevented from being directly touched in the wafer process. Therefore, generation of scratches, cracks, and the like is suppressed, and the characteristics and the manufacturing yield of the image pickup unit are improved.

FIGS. 13A and 13B are diagrams each illustrating a second configuration example of the image pickup unit according to the embodiment. FIG. 13A is a plan view illustrating a configuration example in which a resin layer (an intermediate layer) is provided on the first surface of the substrate, and FIG. 13B is a simplified side view illustrating an overall configuration of the image pickup unit.

An image pickup unit 100B is different from the image pickup unit 100 of FIGS. 3A and 3B in the following points. In the image pickup unit 100B, openings intended to fill a resin layer 130B as an intermediate layer are not formed in an insulating film 113B. Therefore, the image pickup unit 100B does not have a configuration in which the connection pads 140 are connected to the resin layer 130B.

As for a manufacturing method, steps are performed in a similar manner to the steps illustrated in FIG. 5A to FIG. 11C, except that the step of forming the openings in the step ST2 described with reference to FIG. 6A is unnecessary.

Other configurations are similarly to those of the image pickup unit 100 of FIGS. 3A and 3B, and effects similar to those of the image pickup unit 100 of FIGS. 3A and 3B described above are obtainable also in the image pickup unit 100B.

Figure 14A:
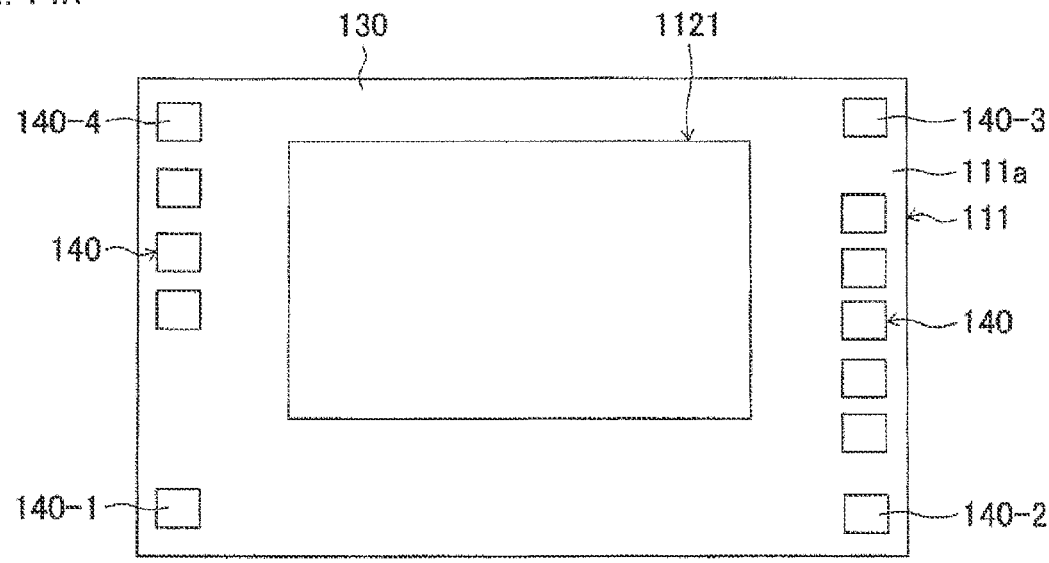
FIGS. 14A and 14B are diagrams each illustrating a third configuration example of the image pickup unit according to the embodiment.
Figure 14B:
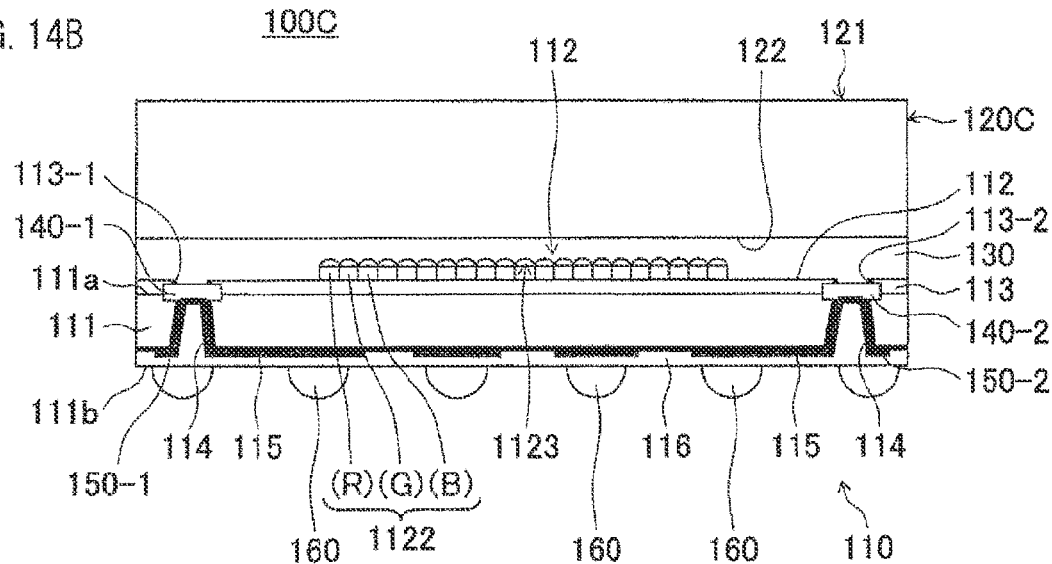

FIGS. 14A and 14B are diagrams each illustrating a third configuration example of the image pickup unit according to the embodiment. FIG. 14A is a plan view illustrating a configuration example in which a resin layer (an intermediate layer) is provided on a first surface of a substrate, and FIG. 14B is a simplified side view illustrating an overall configuration of the image pickup unit.

An image pickup unit 100C is different from the image pickup unit 100 of FIGS. 3A and 3B in the following points. In the image pickup unit 100C, the recessed portion DGG is not formed on a front surface 121C of a seal glass 120C. In other words, in the image pickup unit 100C, the front surface 121C of the seal glass 120C is not processed and remains flat. Therefore, in the manufacturing method, when the glass side is mounted as it is on a stage or the like of a processing apparatus, the surface of the glass substrate is directly touched, thereby causing scratches, cracks, and the like of the glass substrate. Thus, when the image pickup unit 100C with the configuration of FIGS. 14A and 14B is manufactured, instead of formation of a recessed portion on the glass substrate, any of methods illustrated in FIG. 15 to FIG. 17 is employed.

[Method of Manufacturing Image Pickup Unit of FIGS. 14A and 14B]

Figure 15:
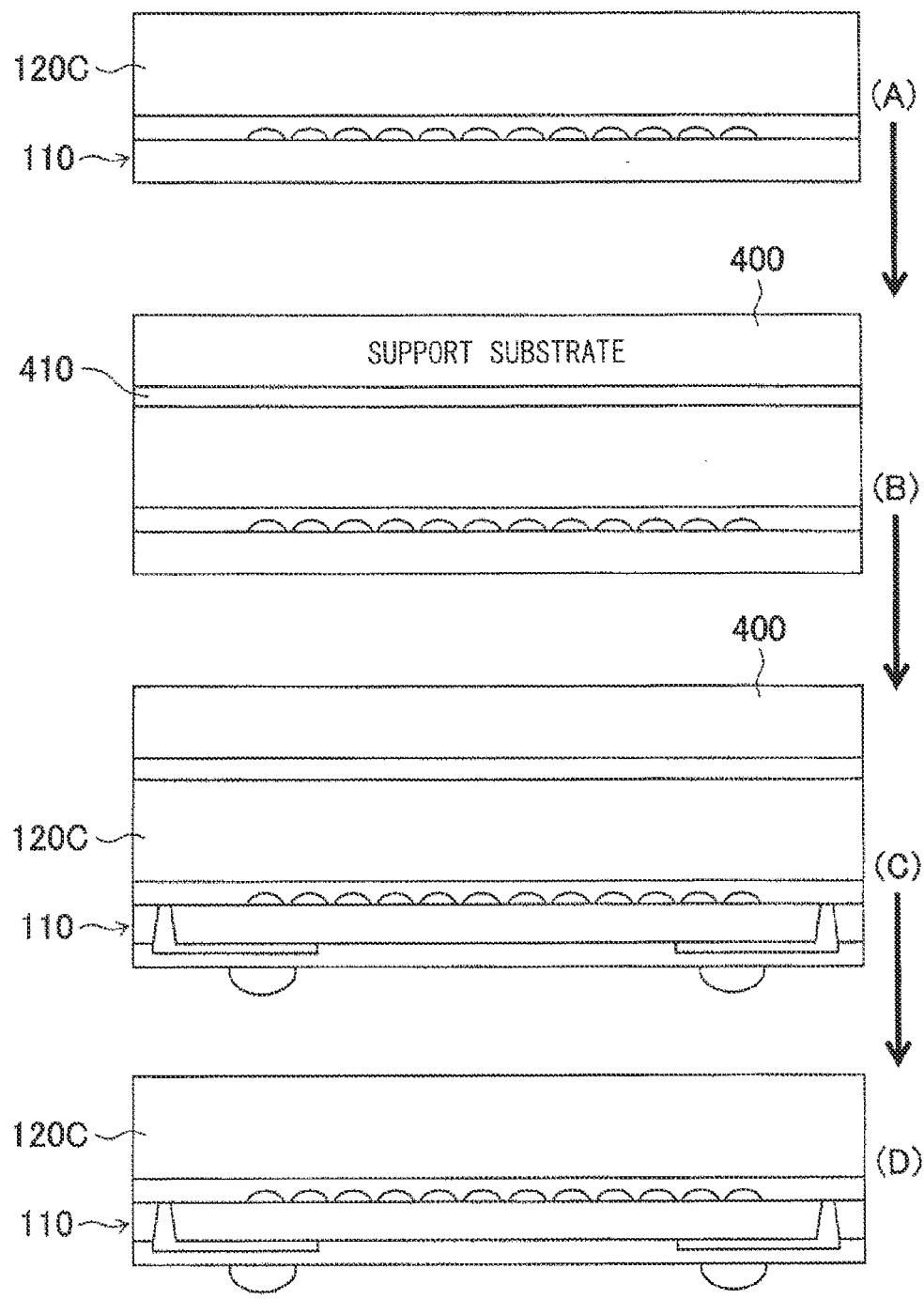
FIG. 15 is a diagram for explaining a first method of manufacturing the image pickup unit of FIGS. 14A and 14B.

In the manufacturing method of FIG. 15, as illustrated in (A) of FIG. 15, the glass substrate 120C is bonded, with use of an adhesive, to the optical device 110 including the optical element region 112 formed on the silicon substrate 111A. Next, as illustrated in (B) of FIG. 15, a support substrate 400 as a support functional board is temporarily bonded to the front surface 121C with use of an adhesive 410. Subsequently, as illustrated in (C) of FIG. 15, basically, the processes such as the formation process of the TSVs and the formation process of the solder balls are performed, and then, the temporarily-bonded support substrate 400 is detached as illustrated in (D) of FIG. 15. Note that the support substrate 400 is formed of Si or a glass substrate.

Figure 16:
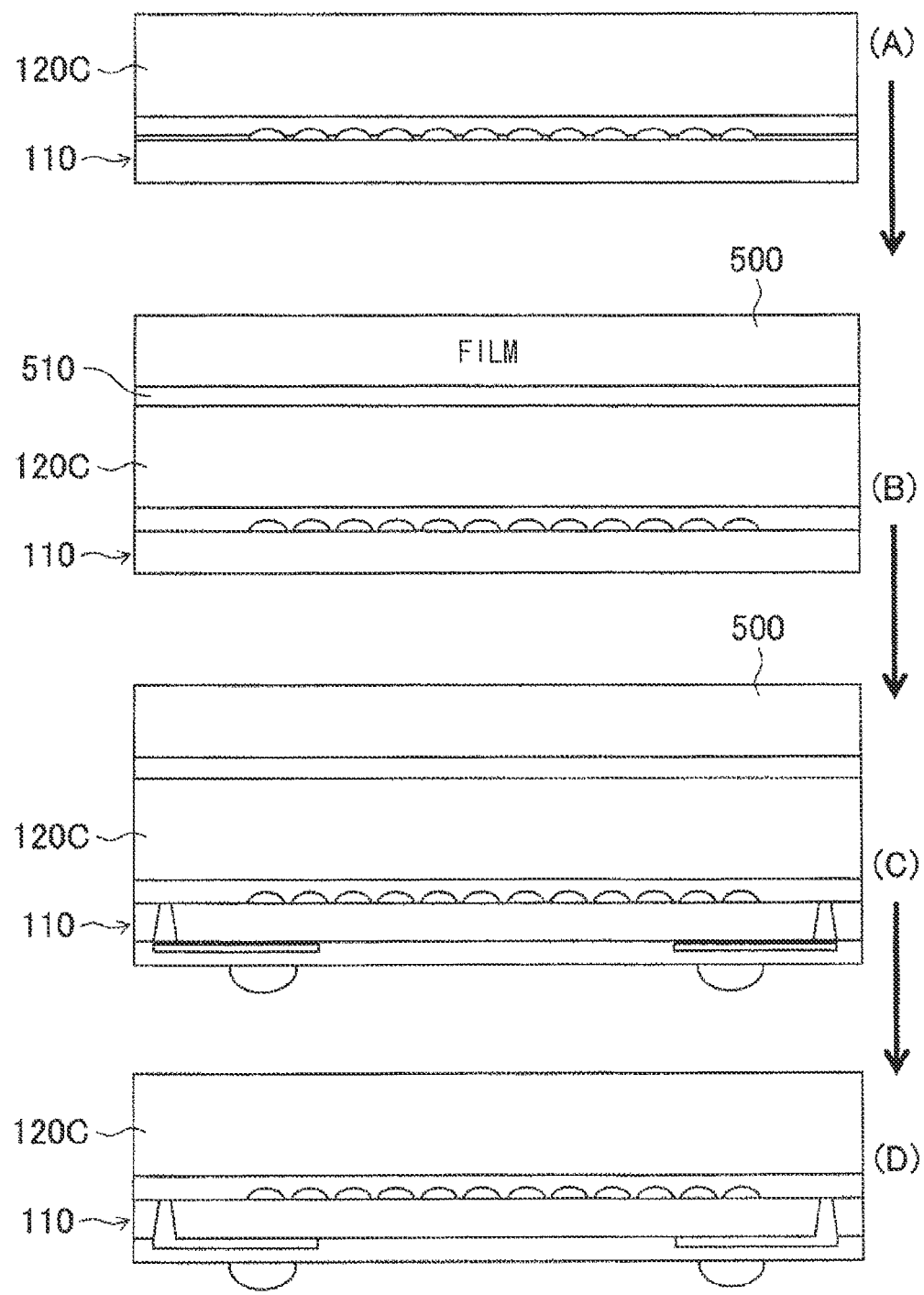
FIG. 16 is a diagram for explaining a second method of manufacturing the image pickup unit of FIGS. 14A and 14B.
Figure 17:
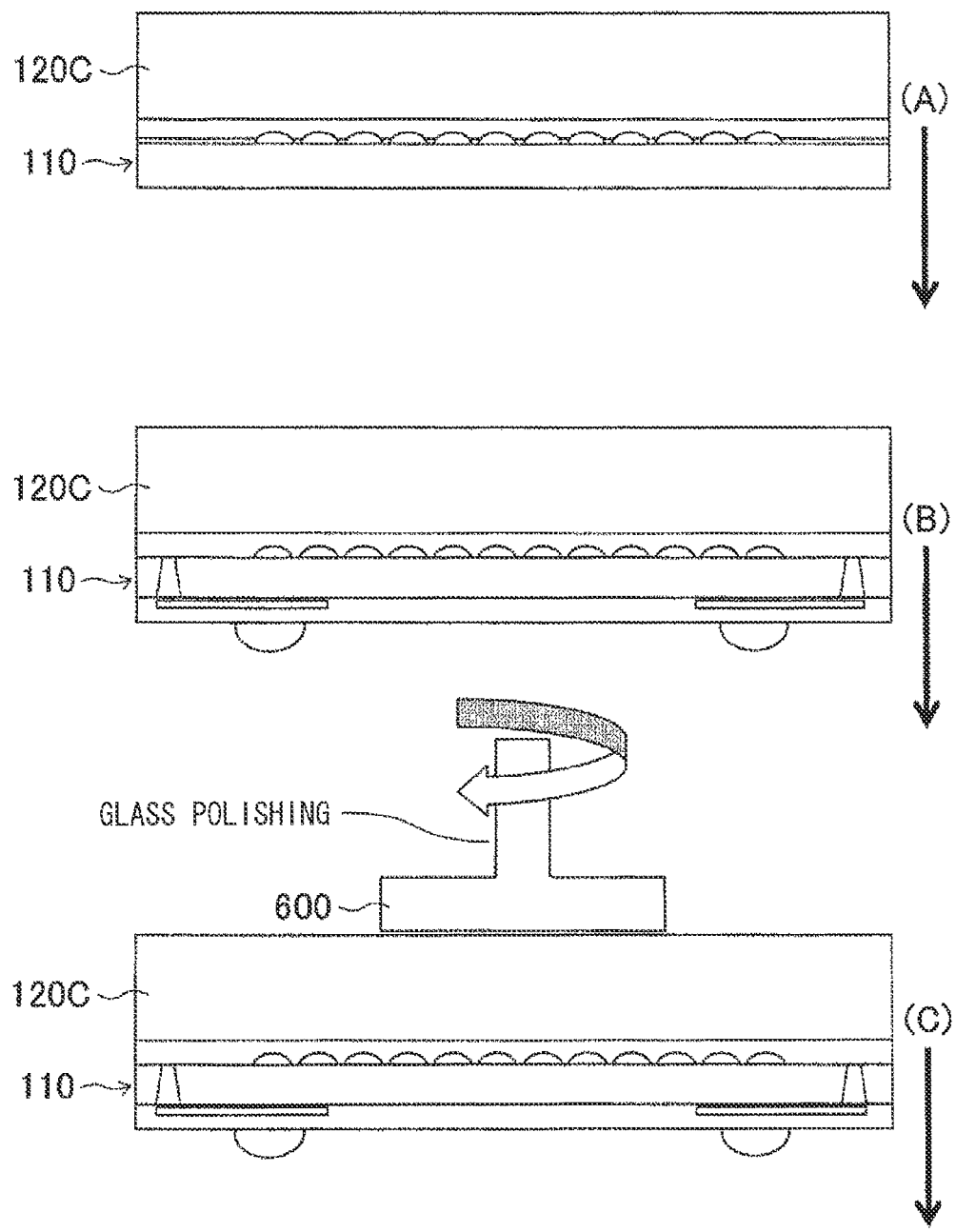
FIG. 17 is a diagram for explaining a third method of manufacturing the image pickup unit of FIGS. 14A and 14B.

In the manufacturing method of FIG. 16, as illustrated in (A) of FIG. 16, the glass substrate 120C is bonded, with use of an adhesive, to the optical device 110 including the optical element region 112 formed on the silicon substrate 111A. Next, as illustrated in (B) of FIG. 16, a protection film 500 as a support functional board is temporarily bonded to the front surface 121C with use of an adhesive 510. Subsequently, as illustrated in (C) of FIG. 16, basically, the processes such as the formation process of the TSVs and the formation process of the solder balls are performed, and then, the temporarily-bonded protection film 500 is detached as illustrated in (D) of FIG. 16.

In the manufacturing method of FIG. 17, as illustrated in (A) of FIG. 17, the glass substrate 120C is bonded, with use of an adhesive, to the optical device 110 including the optical element region 112 formed on the silicon substrate 111A. Subsequently, as illustrated in (B) of FIG. 17, basically, the processes such as the formation process of the TSVs and the formation process of the solder balls are performed. After that, as illustrated in (C) of FIG. 17, the front surface 121C of the glass substrate 120C is polished by a polisher 600.

The polishing of the glass may be performed after the support substrate 400 or the protection film 500 is detached in the method of FIG. 15 or FIG. 16.

Although some portions will be described again, the method of manufacturing the image pickup unit 100C of FIGS. 14A and 14B will be specifically described below with reference to FIG. 18A to FIG. 24C by taking the case where the protection film 500 is used, as an example.

FIG. 18A to FIG. 24C are diagrams for specifically explaining a second method of manufacturing the image pickup unit of FIGS. 14A and 14B. Note that, in the following description, like numerals are used to designate substantially like components of FIG. 5A to FIG. 11C and FIG. 16, for the sake of facilitating the understanding.

(Step ST21)

Figure 18A:
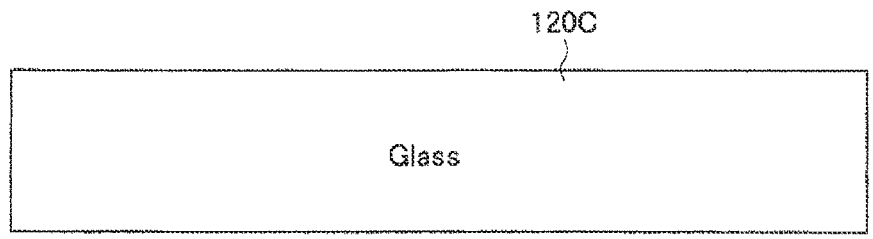
FIGS. 18A to 18C are first diagrams for specifically explaining the second method of manufacturing the image pickup unit of FIGS. 14A and 14B.

As illustrated in FIG. 18A, in a step ST21, the square glass substrate 120C to be the seal glass 120 is prepared, and then the glass substrate 120C is cleaned.

(Step ST22)

Figure 18B:
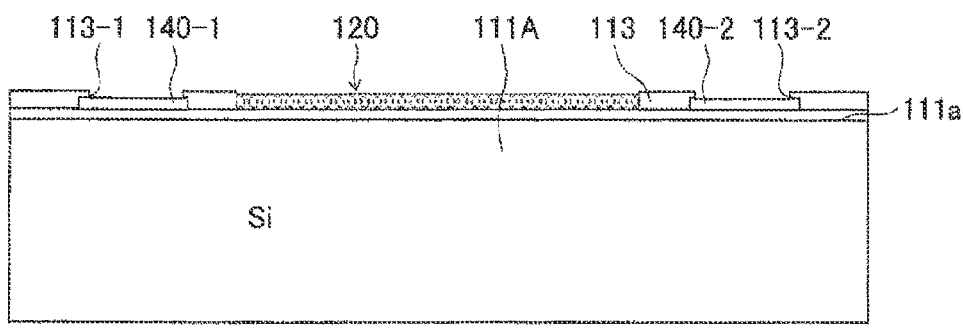

As illustrated in FIG. 18B, in a step ST22, the sensor portion which is the optical element region 112, the connection pads 140, and the like are formed on the first surface 111a of the silicon substrate (the sensor substrate) 111A, and the insulating film 113 is then formed. After that, the openings 113-1 and 113-2 each reaching the connection pad 140 are formed in the insulating film 113.

(Step ST23)

Figure 18C:
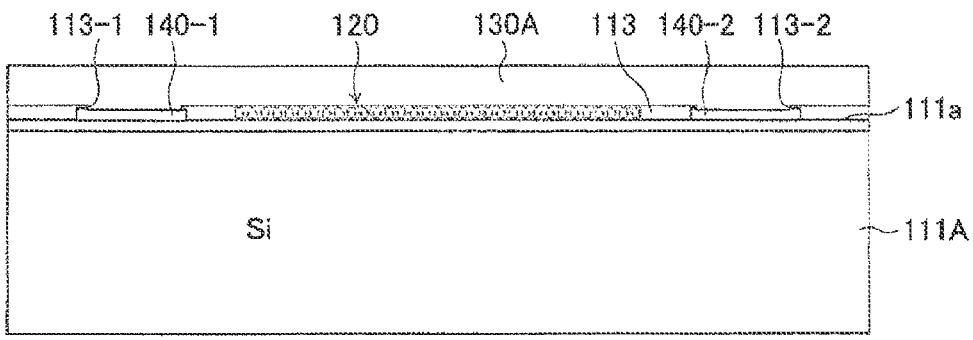

As illustrated in FIG. 18C, in a step ST23, the film 130A is formed on the first surface 111a of the silicon substrate 111A to cover the optical element region 112 and the insulating film 113 as well as to fill the openings 113-1 and 113-2 so as to reach the connection pad 140. The film 130A forms the resin layer 130 as the intermediate layer.

(Step ST24)

Figure 19A:
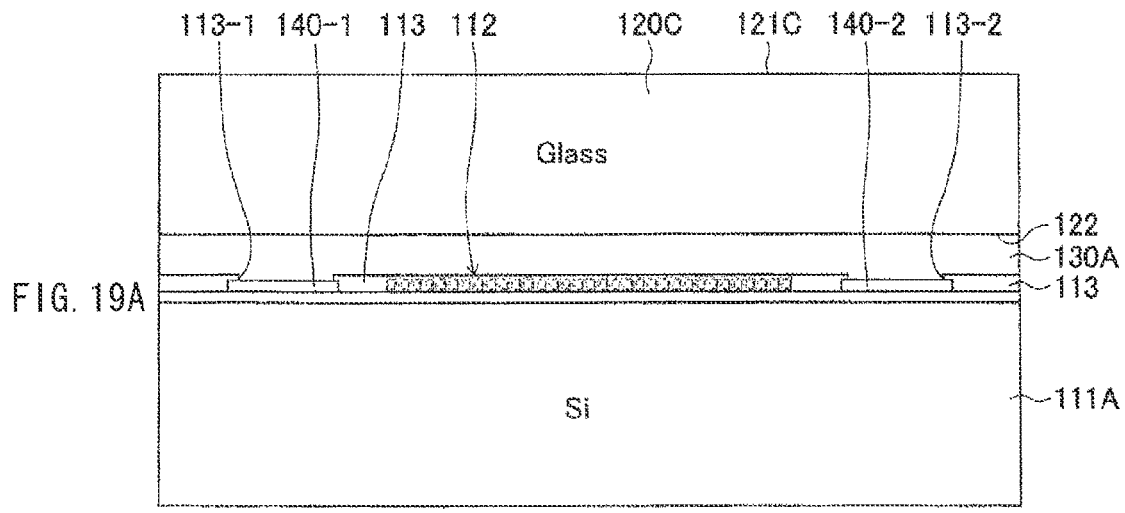
FIGS. 19A and 19B are second diagrams for specifically explaining the second method of manufacturing the image pickup unit of FIGS. 14A and 14B.

As illustrated in FIG. 19A, in a step ST24, the film 130A is bonded to the surface 122 which is not to be the front surface of the glass substrate 120C. In other words, in the step ST24, the glass substrate 120C is bonded through the film 130A to the optical device 110 including the optical element region 112 which is formed on the silicon substrate 111A. The step corresponds to a bonding process.

(Step ST25)

Figure 19B:
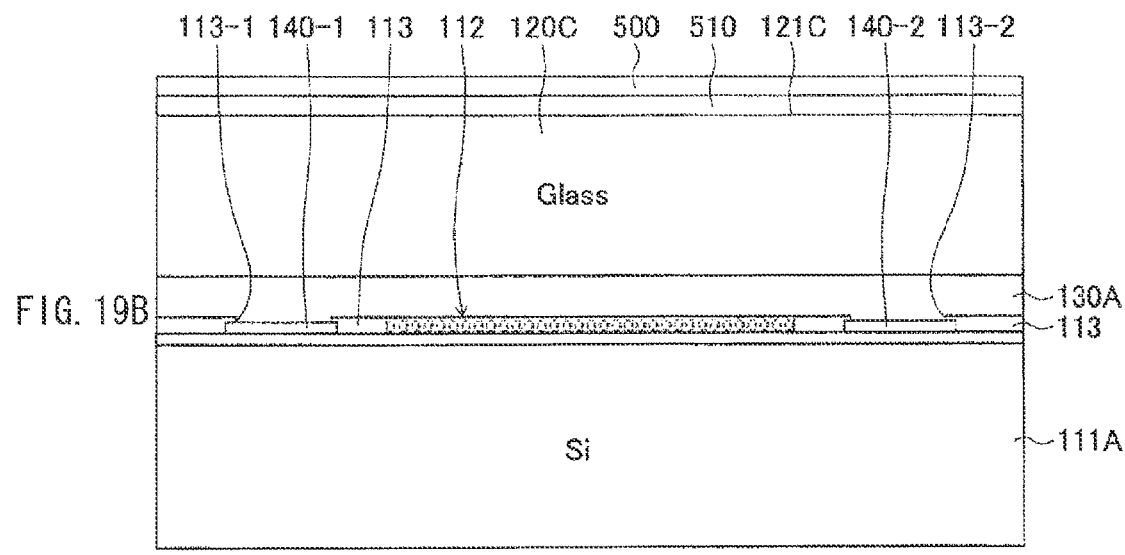

As illustrated in FIG. 19B, in a step ST25, the protection film 500 is temporarily bonded, with use of the adhesive 510, to the surface 121C which is a front surface on a light incident side of the glass substrate 120C. Note that, in the description, although the protection film is bonded corresponding to FIG. 16, if the method corresponds to FIG. 15, the support substrate 400 is temporarily bonded with use of the adhesive 410. The step corresponds to the temporal bonding process. The bonding process in the step ST24 and the temporal bonding process in the step ST25 may be performed in any order. Next and follow steps correspond to a wiring formation process.

(Step ST26)

Figure 20A:
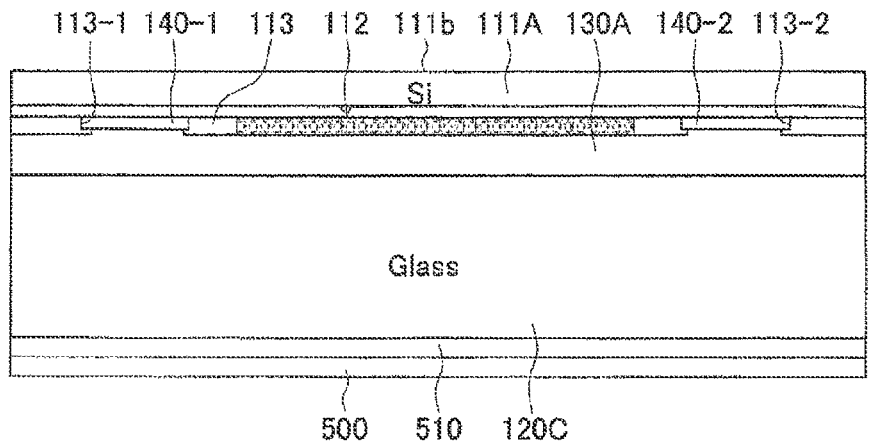
FIGS. 20A to 20C are third diagrams for specifically explaining the second method of manufacturing the image pickup unit of FIGS. 14A and 14B.

As illustrated in FIG. 20A, in a step ST26, the surface 121A side to which the protection film 500 is bonded, of the glass substrate 120C is mounted on a processing apparatus. Then, the second surface 111b of the silicon substrate 111A is abraded by BGR and CMP, to the thickness where via electrodes are allowed to be formed. For example, the silicon substrate 111A having the thickness of about 700 μm is abraded to the thickness of about 100 μm to about 50 μm. As described above, in the manufacturing process, only the protection film 500 bonded to the front surface 121C of the glass substrate 120C is directly touched at the time of being carried or being mounted on a stage or the like of a processing apparatus. Therefore, in a wafer process, the surface 121C of the glass substrate 120C is prevented from being directly touched. As a result, generation of scratches, cracks, and the like is suppressed, and the characteristics and the manufacturing yield of the image pickup unit are improved.

(Step ST27)

Figure 20B:
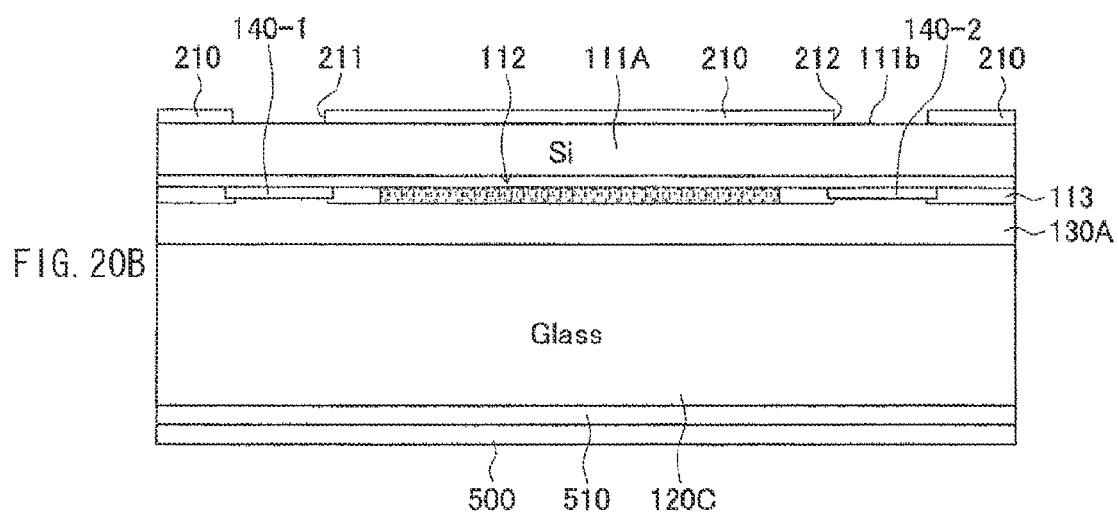

As illustrated in FIG. 20B, in a step ST27, the mask 210 is formed by photolithography and the like in a predetermined position of the second surface 111b of the silicon substrate 111A, except for the predetermined positions 211 and 212 in which the TSVs are to be formed.

(Step ST28)

Figure 20C:
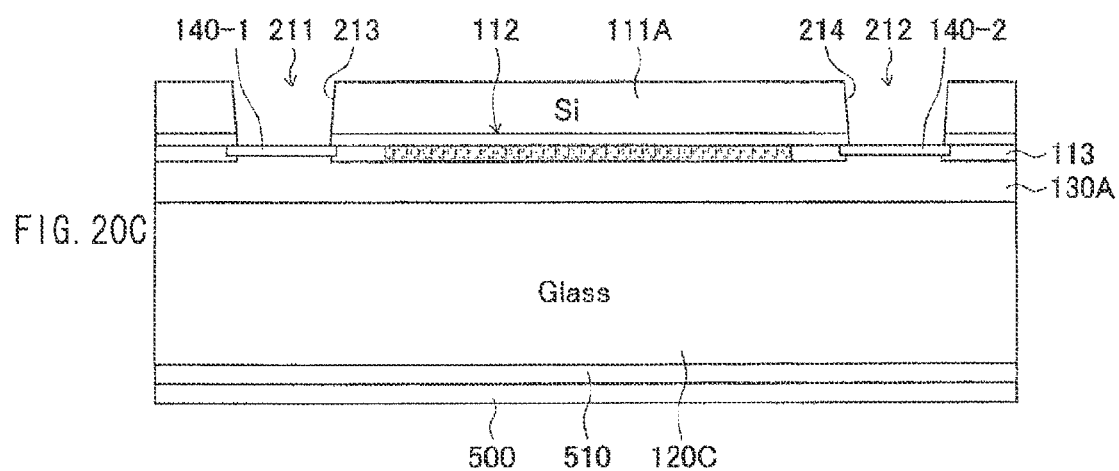

As illustrated in FIG. 20C, in a step ST28, the TSVs 213 and 214 each reaching the connection pad 140 are formed in the predetermined positions 211 and 212 on the second surface 111b of the silicon substrate 111A by etching. After that, the mask 210 is removed. Note that in the processing of the step ST28, the protection film 500 or the support substrate 400 is detached once in some cases in order to eliminate influence of electrostatic chuck (ESC).

(Step ST29)

As illustrated in FIG. 21A, in a step ST29, for example, the oxidized insulating film 215 is formed to have a thickness of about 10 μm on the entire surface including the inside of the TSVs 213 and 214 of the second surface 111b of the silicon substrate 111A. Note that, also in the process of the step ST29, the protection film 500 or the support substrate 400 is detached once in some cases in consideration of process thermal tolerance.

(Step ST30)

As illustrated in FIG. 21B, in a step ST30, etching is performed on the second surface 111b of the silicon substrate 111A to remove the insulating film 215 formed on the bottom of each of the TSVs 213 and 214. As a result, the surfaces of the connection pads 140-1 and 140-2 in the TSVs 213 and 214 are exposed. The remaining insulating film 215 has a thickness smaller than 10 μm.

(Step ST31)

As illustrated in FIG. 21C, in a step ST31, the seed layer 216 as a conductive layer is formed to have a thickness of about 0.1 μm to about 1 μm on the entire surface including the inside of the TSVs 213 and 214 of the second surface 111b of the silicon substrate 111A. The seed layer 216 is formed of a stacked film of, for example, titanium (Ti) and copper (Cu). Note that, also in the process of the step ST31, the protection film 500 or the support substrate 400 is detached once in some cases in order to eliminate influence of ESC.

(Step ST32)

As illustrated in FIG. 22A, in a step ST32, the resist 217 is bonded to the entire surface including above the TSVs 213 and 214 on the second surface 111b of the silicon substrate 111A. Incidentally, if the protection film 500 or the support substrate 400 has been detached once in the steps ST28 to ST31, the protection film 500 or the support substrate 400 is bonded again.

(Step ST33)

As illustrated in FIG. 22B, in a step ST33, the resist 217 is removed from the inside of the TSVs 213 and 214 and the surrounding regions of the TSVs 213 and 214 on the second surface 111b of the silicon substrate 111A.

(Step ST34)

As illustrated in FIG. 22C, in a step ST34, the wiring layer 218 is formed to have a thickness of about 5 μm inside the TSVs 213 and 214 and in the surrounding regions of the TSVs 213 an 214 on the second surface 111b of the silicon substrate 111A. The wiring layer 218 is formed of, for example, Cu. Then, the wiring 115 in FIG. 3B is formed by the wiring layer 218 and the seed layer 216.

(Step ST35)

Figure 23A:
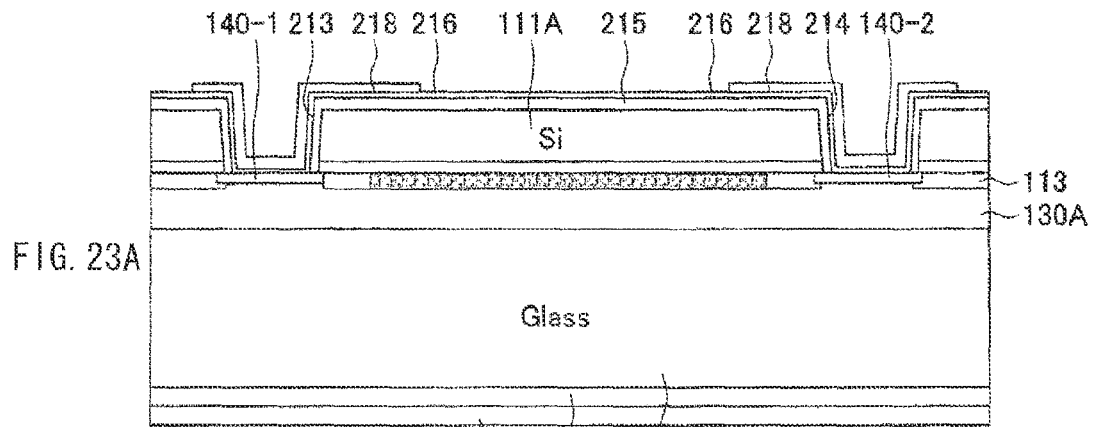
FIGS. 23A to 23C are sixth diagrams for specifically explaining the second method of manufacturing the image pickup unit of FIGS. 14A and 14B.

As illustrated in FIG. 23A, in a step ST35, the resist 217 remaining on the second surface 111b of the silicon substrate 111A is removed.

(Step ST36)

Figure 23B:
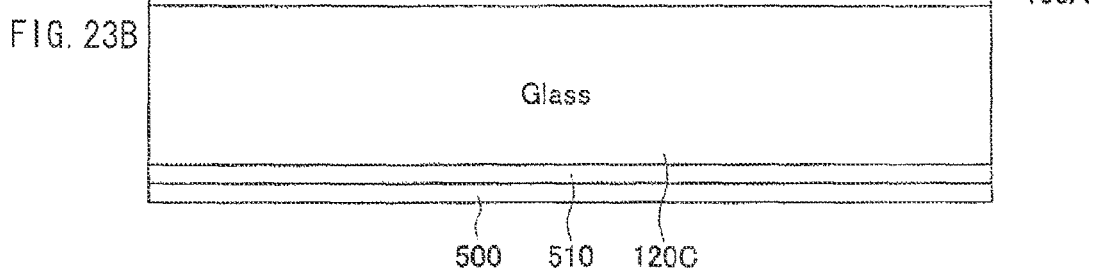

As illustrated in FIG. 23B, in a step ST36, the seed layer 216 is removed, by etching, from a region in which the wiring layer 218 is not formed and the boundary region thereof on the second surface 111b of the silicon substrate 111A.

(Step ST37)

Figure 23C:
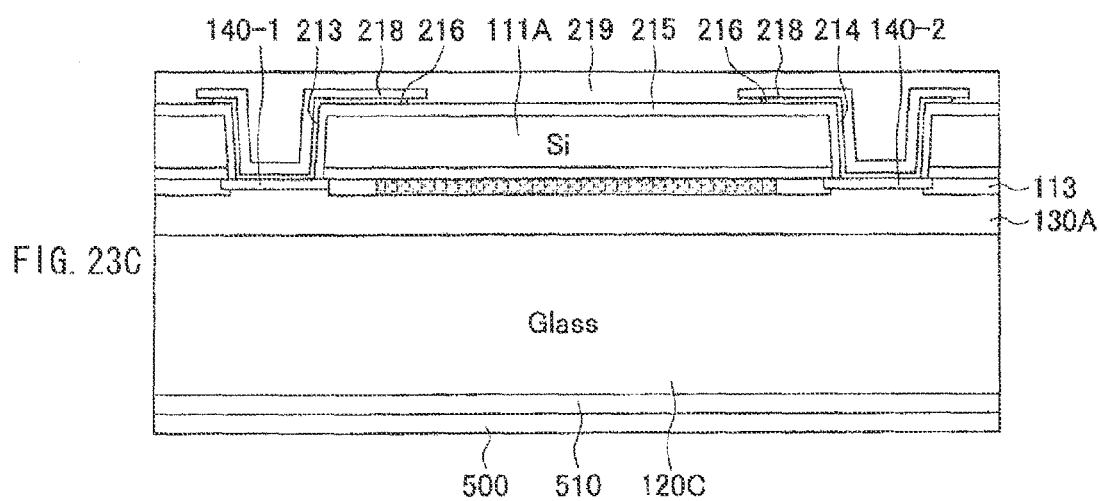

As illustrated in FIG. 23C, in a step ST37, the solder mask 219 is formed on the entire surface including above the TSVs 213 and 214 on the second surface 111b of the silicon substrate 111A.

(Step ST38)

Figure 24A:
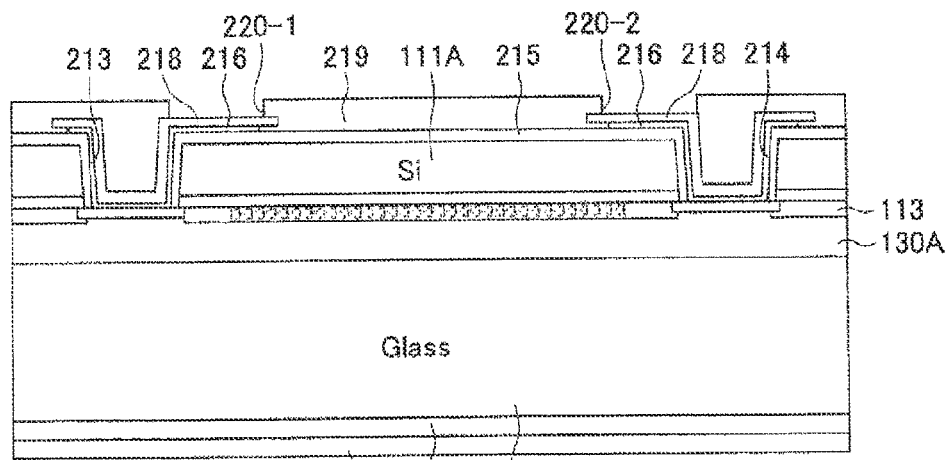
FIGS. 24A to 24C are seventh diagrams for specifically explaining the second method of manufacturing the image pickup unit of FIGS. 14A and 14B.

As illustrated in FIG. 24A, in a step ST38, the openings 220-1 and 220-2 each reaching the wiring layer 218 are formed in the solder mask 219 in a region which is adjacent a region inner than the region formed with the TSVs 213 and 214 on the second surface 111b of the silicon substrate 111A.

(Step ST39)

Figure 24B:
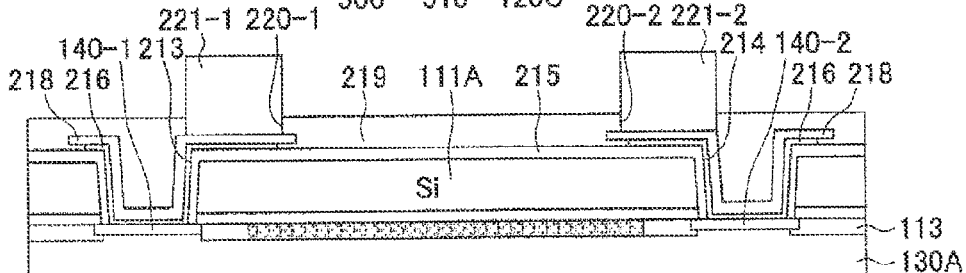

As illustrated in FIG. 24B, in a step ST39, the solders 221-1 and 221-2 are printed in the openings 220-1 and 220-2 on the second surface 111b of the silicon substrate 111A so as to reach the wiring layer 218 and to be exposed from the openings 220-1 and 220-2.

(Step ST40)

Figure 24C:
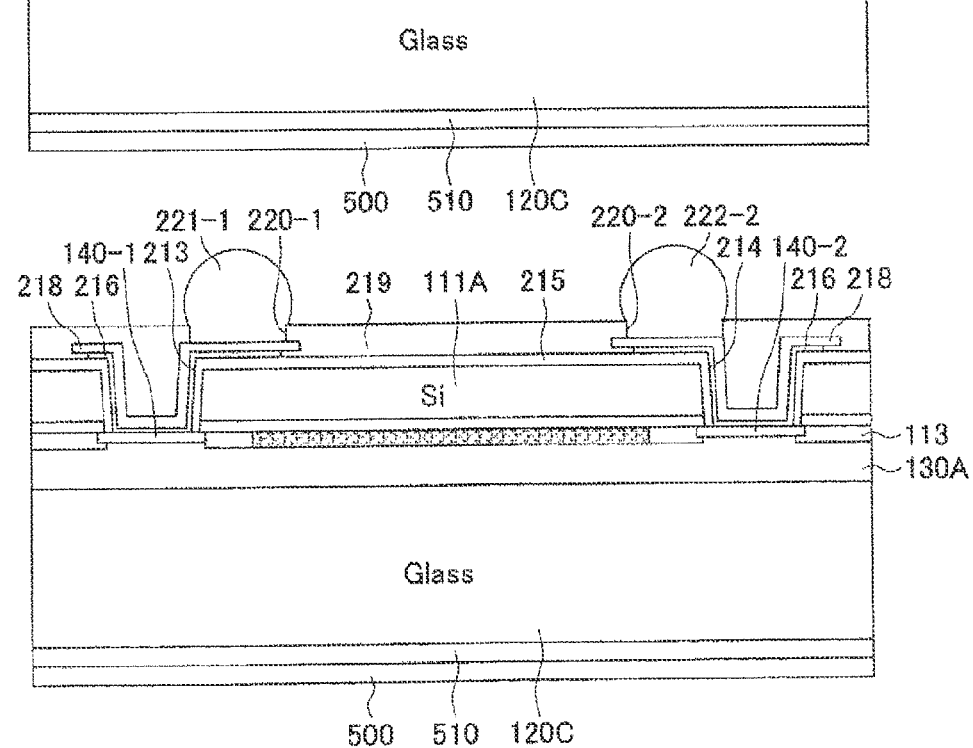

As illustrated in FIG. 24C, in a step ST40, the solder balls 222-1 and 222-2 are formed by reflow. The solder balls 222-1 and 222-2 form the external connection terminals 160 in FIG. 14B.

After the reflow, a step of polishing the glass substrate 120A may be added. In this case, a protection tape protecting the solder balls is put on the solder balls because the polishing of the glass substrate 120A is performed in a state where the solder balls are located on a downside. The protection tape is detached after the polishing is ended.

In this way, the manufacturing of the image pickup unit 100C is completed.

According to the embodiment, the support substrate 400 or the protection film 500 is temporarily bonded on the front surface 121C of the glass substrate 120C with an adhesive in the manufacturing process, or the front surface 121C is polished after the manufacturing process. Accordingly, in the wafer process in manufacturing, only the support substrate or the protection film bonded to the front surface of the seal glass 120 is directly touched at the time of being carried or being mounted on a stage or the like of a processing apparatus. Therefore, in the wafer process, the front surface 121 of the seal glass 120 is prevented from being directly touched. As a result, generation of scratches, cracks, and the like is suppressed, and the characteristics and the manufacturing yield of the image pickup unit are improved. As described above, since the seal glass 120 of the embodiment is formed by recessing the glass itself along the inner region 1211 without using a separate member for recessing, the enlargement of the image pickup unit, the complication of processes, and the increase in cost are prevented while generation of scratches, cracks, and the like in the seal member is suppressed. As a result, according to the embodiment, it may be possible to improve the characteristics and the manufacturing yield of the image pickup unit.

Figure 25A:
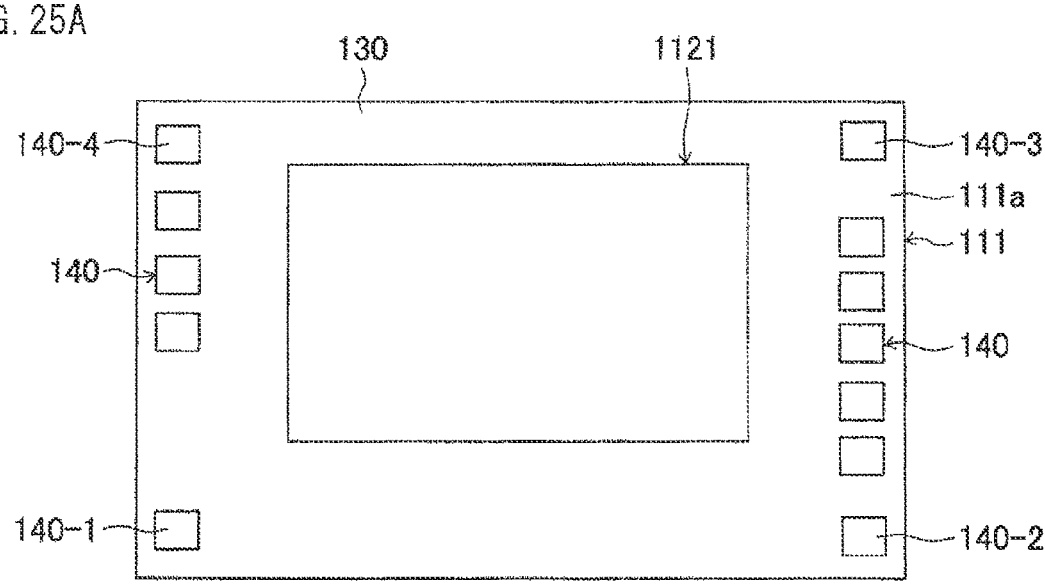
FIGS. 25A and 25B are diagrams each illustrating a fourth configuration example of the image pickup unit according to the embodiment.
Figure 25B:
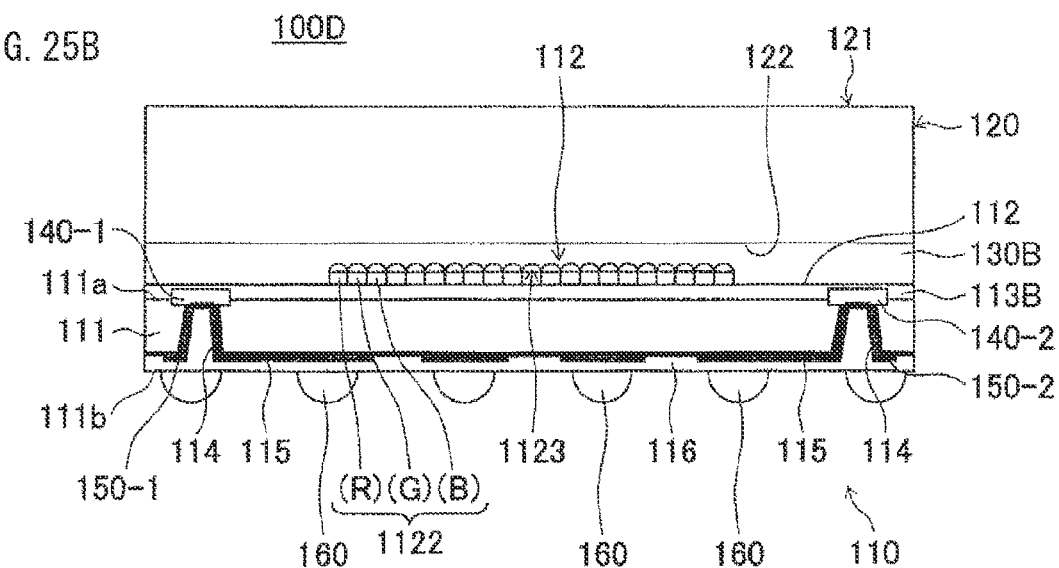

FIGS. 25A and 25B are diagrams each illustrating a fourth configuration example of the image pickup unit according to the embodiment. FIG. 25A is a plan view illustrating a configuration example in which a resin layer (an intermediate layer) is provided on a first surface of a substrate, and FIG. 25B is a simplified side view illustrating an overall configuration of the image pickup unit.

An image pickup unit 100D is different from the image pickup unit 100C of FIGS. 14A and 14B in the following points. In the image pickup unit 100D, openings intended to fill a resin layer 130D as an intermediate layer are not formed in an insulating film 113D. Therefore, the image pickup unit 100D does not have a configuration in which the connection pads 140 are connected to the resin layer 130D.

As for a manufacturing method, steps are performed in a similar manner to the steps illustrated in FIG. 18A to FIG. 25C, except that the step of forming the openings in the step ST22 described with reference to FIG. 18B is unnecessary.

Other configurations are similar to those of the image pickup unit 100C of FIGS. 14A and 14B, and effects similar to those of the image pickup unit 100C of FIGS. 14A and 14B described above are obtainable also in the image pickup unit 100D.

Note that the technology may be configured as follows.

An image pickup device comprising: a seal member having a first surface, the first surface of the seal member including a concave portion; and an optical device coupled to a second surface of the seal member, the second surface of the seal member being opposite from the first surface of the seal member.

The concave portion of the seal member may include an outer region and an inner region, the outer region protruding beyond the inner region by a distance (D) in a direction perpendicular to the second surface of the seal member.

The optical device may include an optical element region formed on a first surface of a substrate, the first surface of the substrate facing toward the seal member and the optical element region being configured to perform photoelectric conversion.

The second surface of the seal member may be adhered to the optical device by a resin layer.

The optical device may include a connection pad formed on the first surface of the substrate, and the connection pad may be connected to an external connection terminal formed on a second surface of the substrate through a via electrode, the second surface of the substrate being opposite from the first surface of the substrate.

An insulating layer may be formed on the first surface of the substrate, and a portion of the insulating layer is formed between the connection pad and the resin layer.

The connection pad may be in direct contact with the resin layer.

The outer region may protrude beyond the inner region at a step having a lateral wall, the lateral wall being nearly parallel to the direction perpendicular to the first surface of the seal member.

The concave portion may include an outer region and an inner region on the first surface of the seal member, the outer region protruding beyond the inner region by a distance (D) in a direction perpendicular to the first surface of the seal member, and the inner surface region may align with the optical element region in the direction perpendicular to the first surface of the seal member.

A method for making an image pickup device, the method comprising the steps of: forming a concave portion on a first surface of a seal member; and coupling an optical device to a second surface of the seal member, the second surface of the seal member being opposite from the first surface of the seal member.

In the step of forming the concave portion, an outer region and an inner region may be formed on the first surface of the seal member, the outer surface region being formed to protrude beyond the inner surface region by a distance (D) in a direction perpendicular to the second surface of the seal member.

In the method for making an image pickup device, the optical device may include an optical element region formed on a first surface of a substrate, the optical element region being configured to perform photoelectric conversion and the first surface of the substrate facing toward the seal member.

In the step of coupling the optical device to the second surface of the seal member, the second surface of the seal member may be adhered to the optical device by a resin layer.

In the method for making an image pickup device, the optical device may include a connection pad formed on the first surface of the substrate, and the connection pad may be connected to an external connection terminal formed on a second surface of the substrate through a via electrode, the second surface of the substrate being opposite from the first surface of the substrate.

In the method for making an image pickup device, an insulating layer may be formed on the first surface of the substrate, and a portion of the insulating layer is formed between the connection pad and the resin layer.

In the method for making an image pickup device, the connection pad may be in direct contact with the resin layer.

In the step of forming the concave portion, the outer region may be formed to protrude beyond the inner region at a step having a lateral wall, the lateral wall being nearly parallel to the direction perpendicular to the first surface of the seal member.

In the step of forming the concave portion, the concave portion may be formed to include an outer region and an inner region on the first surface of the seal member, the outer region protruding beyond the inner region by a distance (D) in a direction perpendicular to the first surface of the seal member, and the inner surface region may align with the optical element region in the direction perpendicular to the first surface of the seal member.

A method for making a second image pickup device, the method comprising the steps of: coupling a second surface of a seal member to an optical device; coupling a first surface of the seal member to a protective member, the first surface of the seal member being opposite from the second surface of the seal member; removing the protective member.

The method for making the second image pickup device may further comprise the step of performing fabrication processing on the image pickup device, wherein the step of performing processing on the image pickup device is performed after the step of coupling the first surface of the seal member to the protective member.

In the method for making the second image pickup device, the protective member may be a support substrate.

In the second method for making the second image pickup device, the protective member may be a protective film.

The method for making the second image pickup device may further comprise the step of polishing the first surface of the seal member after the step of removing the protective member.

The second image device may comprise: a seal member having a first surface, wherein the first surface is a polished surface; and an optical device coupled to a second surface of the seal member, the second surface of the seal member being opposite from the first surface of the seal member.

Another image pickup unit comprises: an optical device including an optical element region, wirings, and external connection terminals, the optical element region being provided on a first surface of a substrate and functioning as a light receiver, and the wirings and the external connection terminals being provided on a second surface opposite to the first surface of the substrate; and an optically-transparent seal member provided to cover a region including the optical element region of the optical device, thereby to protect the optical element region, wherein the region including the optical element region of the optical device is bonded to a back surface of the seal member, the back surface being opposite to a front surface as a light incident surface of the seal member, and the seal member is provided with an inner region on the front surface, the inner region being defined as a region corresponding to the optical element region of the optical device and being lower in height than an outer region on the front surface.

The optical device may include connection pads provided on the first surface along the optical element region, and via electrodes each passing through the substrate from the second surface to the first surface to be connected to the connection pads and each being connected to the wirings on the second surface.

The another image pickup unit comprises may further comprise an intermediate layer provided between the optical element region on the front surface of the optical device and the back surface of the seal member at least in a region corresponding to the optical element region, the intermediate layer wholly bonding the optical element region of the optical device and the back surface of the seal member.

The optical device may include an insulating film provided on the first surface of the substrate, the insulating film may include openings each reaching the connection pad from the second surface side, and the openings may be filled with the intermediate layer to allow the connection pads to be in contact with the intermediate layer.

Another image pickup unit comprises: an optical device including an optical element region, wirings, and external connection terminals, the optical element region being provided on a first surface of a substrate and functioning as a light receiver, and the wirings and the external connection terminals being provided on a second surface opposite to the first surface of the substrate; an optically-transparent seal member provided to cover a region including the optical element region of the optical device, thereby to protect the optical element region; an intermediate layer provided between the optical element region on a front surface as a light incident surface of the optical device and a back surface of the seal member at least in a region corresponding to the optical element region, the intermediate layer wholly bonding the optical element region of the optical device and the back surface of the seal member, the back surface being opposite to the front surface of the seal member; connection pads provided on the first surface along the optical element region; via electrodes each passing through the substrate from the second surface to the first surface to be connected to the connection pads and each being connected to the wirings on the second surface; and an insulating film provided on the first surface of the substrate, wherein the insulating film includes openings each reaching the connection pad from the second surface side, and the openings is filled with the intermediate layer to allow the connection pads to be in contact with the intermediate layer.

The front surface of the seal member may be polished.

In another method of manufacturing an image pickup unit, the method comprises: forming a recessed portion on a front surface as a light incident surface of an optically-transparent seal member which is provided to protect an optical element region of an optical device, the optical element region being provided on a first surface of a substrate and functioning as a light receiver, the recessed portion being formed in an inner region defined as a region corresponding to the optical element region of the optical device and being lower in height than an outer region on the front surface; bonding a region including the optical element region of the optical device to a back surface of the seal member, the back surface being opposite to the front surface of the seal member; and forming wirings and external connection terminals on a second surface opposite to the first surface of the substrate of the optical device, while supporting the front surface of the seal member.

The another method of manufacturing the image pickup unit may further comprise abrading the second surface of the substrate to a thickness which allows via electrodes to be formed, before formation of the wirings, wherein via electrodes are formed in the formation of the wirings, the via electrodes each passing through the substrate from the second surface to the first surface to be connected to connection pads and each being connected to the wirings on the second surface, the connection pads being provided on the first surface along the optical element region.

The another method of manufacturing the image pickup unit wherein an intermediate layer is formed to fill a gap between the optical element region on the front surface of the optical device and the back surface of the seal member at least in a region corresponding to the optical element region, the intermediate layer allowing the optical element region of the optical device to be bonded to the back surface of the seal member.

The another method of manufacturing the image pickup unit may further comprise: providing an insulating film on the first surface of the substrate of the optical device; and forming openings on the insulating film before the bonding of the optical element region of the optical device and the back surface of the seal member, the openings each reaching the connection pad from the second surface side of the substrate, wherein the intermediate layer is filled in the openings to be in contact with the connection pads in the bonding.

Another method of manufacturing an image pickup unit, the method comprising: (A) bonding a region including an optical element region of an optical device to a back surface of an optically-transparent seal member, the optical element region being provided on a first surface of a substrate and functioning as a light receiver, the seal member provided to cover a region including the optical element region of the optical device, thereby to protect the optical element region, the back surface being opposite to a front surface as a light incident surface of the seal member; (B) temporarily bonding a support functional board as a protection member to the front surface of the seal member; and (C) forming wirings and external connection terminals on a second surface opposite to the first surface of the substrate of the optical device, while supporting the support functional board on the front surface of the seal member, wherein the (A) and the (B) are performed in any order.

Another method of manufacturing an image pickup unit, the method comprising: bonding a side provided with an optical element region of an optical device to a back surface of an optically-transparent seal member, the optical element region being provided on a first surface of a substrate and functioning as a light receiver, the seal member protecting the side provided with the optical element region of the optical device, the back surface being opposite to a front surface on a light incident side of the seal member; and forming wirings and external connection terminals on a second surface opposite to the first surface of the substrate of the optical device, while supporting the front surface of the seal member, wherein the front surface of the seal member is polished after the external connection terminals are formed in formation of the wirings.

The another method of manufacturing an image pickup unit may further comprise abrading the second surface of the substrate to a thickness which allows via electrodes to be formed, before formation of the wirings, wherein via electrodes are formed in the formation of the wirings, the via electrodes each passing through the substrate from the second surface to the first surface to be connected to connection pads and each being connected to the wirings on the second surface, the connection pads being provided on the first surface along the optical element region.

The another method of manufacturing the image pickup unit wherein an intermediate layer is formed to fill a gap between the optical element region on the front surface of the optical device and the back surface of the seal member at least in a region corresponding to the optical element region, the intermediate layer allowing the optical element region of the optical device to be bonded to the back surface of the seal member.

The another method of manufacturing an image pickup unit may further comprise providing an insulating film on the first surface of the substrate of the optical device; and forming openings on the insulating film before the bonding of the optical element region of the optical device and the back surface of the seal member, the openings each reaching the connection pad from the second surface side of the substrate, wherein the intermediate layer is filled in the openings to be in contact with the connection pads in the bonding.

The another method of manufacturing the image pickup unit wherein via electrodes are formed in the formation of the wirings, the via electrodes each passing through the substrate from the second surface to the first surface to be connected to connection pads and being connected to the wirings on the second surface, the connection pads being provided on the first surface along the optical element region, the support functional board temporarily bonded is detached after formation of the via electrodes, and the support functional board is temporarily bonded again before formation of wirings.

The another method of manufacturing the image pickup unit wherein in formation of the wirings, the support functional board temporarily bonded is detached after formation of some wirings, and the support functional board is temporarily bonded again before formation of other wirings.

The another method of manufacturing the image pickup unit wherein in formation of the wirings, the front surface of the seal member is polished after the external connection terminals are formed and the support functional board is detached.

The present application contains subject matter related to that disclosed in Japanese Priority Patent Application JP 2012-003873 filed in the Japan Patent Office on Jan. 12, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An image pickup device, comprising:
    an optically-transparent seal member that has a first surface, wherein the first surface of the seal member includes a concave portion that has a first area,
        wherein the concave portion of the seal member includes an outer region as a light waveguide and an inner region;
    an optical device coupled to a second surface of the seal member, wherein the second surface of the seal member is opposite from the first surface of the seal member, the optical device includes an optical sensor with a light receiving surface that has a second area; and
    a resin layer which fills a gap between the light receiving surface and the second surface of the seal member.

2. The image pickup device according to claim 1, wherein the outer region protrudes beyond the inner region by a distance (D) in a direction perpendicular to the second surface of the seal member.

3. The image pickup device according to claim 1, wherein the optical sensor includes an optical element region on a first surface of a substrate, wherein the first surface of the substrate faces toward the seal member and the optical element region is further configured for photoelectric conversion.

4. The image pickup device according to claim 3, wherein the second surface of the seal member is adhered to the optical device by the resin layer.

5. The image pickup device according to claim 4, wherein
    the optical device includes a connection pad on the first surface of the substrate, and
    the connection pad is connected to an external connection terminal on a second surface of the substrate through a via-electrode, wherein the second surface of the substrate is opposite from the first surface of the substrate.

6. The image pickup device according to claim 5, wherein
    an insulating layer is on the first surface of the substrate, and
    a portion of the insulating layer is between the connection pad and the resin layer.

7. The image pickup device according to claim 5, wherein the connection pad is in direct contact with the resin layer.

8. The image pickup device according to claim 2, wherein the outer region protrudes beyond the inner region at a step that has a lateral wall, wherein the lateral wall is nearly parallel to the direction perpendicular to the first surface of the seal member.

9. The image pickup device according to claim 3, wherein the concave portion includes an outer region and an inner region on the first surface of the seal member, the outer region protrudes beyond the inner region by a distance (D) in a direction perpendicular to the first surface of the seal member, and
  the inner surface region aligns with the optical element region in the direction perpendicular to the first surface of the seal member.

10. An image pickup device, comprising:
  an optically-transparent seal member that has a first surface, wherein the first surface is a polished surface that includes a concave portion,
    wherein the concave portion includes an outer region as a light waveguide and an inner region;
  an optical device coupled to a second surface of the seal member, the second surface of the seal member is opposite from the first surface of the seal member, wherein the optical device includes an optical sensor with a light receiving surface; and
  a resin layer which fills a gap between the light receiving surface and the second surface of the seal member.

11. The image pickup device according to claim 1, wherein the first area is larger than the second area.

12. The image pickup device according to claim 1, wherein the seal member has a thickness in range of 450 μm to 800 μm and a refractive index of about 1.5.

13. The image pickup device according to claim 1, wherein the resin layer has a thickness in range of 10 μm to 100 μm.

14. The image pickup device according to claim 1, wherein the light waveguide is further configured to guide light for a distance, towards a region with a connection pad.

* * * * *